US012211869B2

(12) United States Patent
Hsieh et al.

(10) Patent No.: US 12,211,869 B2
(45) Date of Patent: *Jan. 28, 2025

(54) OPTICAL BLOCKING STRUCTURES FOR BLACK LEVEL CORRECTION PIXELS IN AN IMAGE SENSOR

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Kuo-Cheng Lee, Tainan (TW); Hsin-Chi Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,206

(22) Filed: Jul. 25, 2023

(65) Prior Publication Data
US 2023/0369364 A1 Nov. 16, 2023

Related U.S. Application Data

(62) Division of application No. 17/191,393, filed on Mar. 3, 2021, now Pat. No. 11,996,428.

(51) Int. Cl.
*H01L 27/146* (2006.01)

(52) U.S. Cl.
CPC .. *H01L 27/14623* (2013.01); *H01L 27/14609* (2013.01); *H01L 27/14629* (2013.01); *H01L 27/14605* (2013.01); *H01L 27/14627* (2013.01)

(58) Field of Classification Search
CPC ......... H01L 27/14623; H01L 27/14609; H01L 27/14629; H01L 27/14605;
(Continued)

(56) References Cited

U.S. PATENT DOCUMENTS

2010/0201834 A1 8/2010 Maruyama et al.
2014/0061839 A1* 3/2014 Ting .................... H01L 27/1464
438/70
(Continued)

FOREIGN PATENT DOCUMENTS

CN 108028260 A 5/2018
CN 111029349 A 4/2020
(Continued)

OTHER PUBLICATIONS

Taiwan Patent Office; Application No. 110115802 Office Action dated Mar. 3, 2022; 7 pages.

*Primary Examiner* — Kimberly N Rizkallah
*Assistant Examiner* — Zhijun Xu
(74) *Attorney, Agent, or Firm* — The Marbury Law Group, PLLC

(57) ABSTRACT

An image sensor includes an array of image pixels and black level correction (BLC) pixels. Each BLC pixel includes a BLC pixel photodetector, a BLC pixel sensing circuit, and a BLC pixel optics assembly configured to block light that impinges onto the BLC pixel photodetector. Each BLC pixel optics assembly may include a first portion of a layer stack including a vertically alternating sequence of first material layers having a first refractive index and second material layers having a second refractive index. Additionally or alternatively, each BLC pixel optics assembly may include a first portion of a layer stack including at least two metal layers, each having a respective wavelength sub-range having a greater reflectivity than another metal layer. Alternatively or additionally, each BLC pixel optics assembly may include an infrared blocking material layer that provides a higher absorption coefficient than color filter materials within image pixel optics assemblies.

20 Claims, 25 Drawing Sheets

(58) Field of Classification Search
CPC ........... H01L 27/14627; H01L 27/1464; H01L 27/14625; H01L 27/14643
See application file for complete search history.

(56) References Cited

U.S. PATENT DOCUMENTS

| | | |
|---|---|---|
| 2018/0277584 A1 | 9/2018 | Maruyama |
| 2019/0148431 A1* | 5/2019 | Cheng ............... H01L 27/14627 257/432 |
| 2020/0119072 A1 | 4/2020 | Lim |
| 2021/0305291 A1* | 9/2021 | Liao ................. H01L 27/14636 |
| 2021/0351217 A1* | 11/2021 | Akiyama ............. G02B 5/3058 |

FOREIGN PATENT DOCUMENTS

| | | |
|---|---|---|
| TW | 201230313 A | 7/2012 |
| TW | 202042384 A | 11/2020 |
| WO | 2020122038 A1 | 6/2020 |

\* cited by examiner

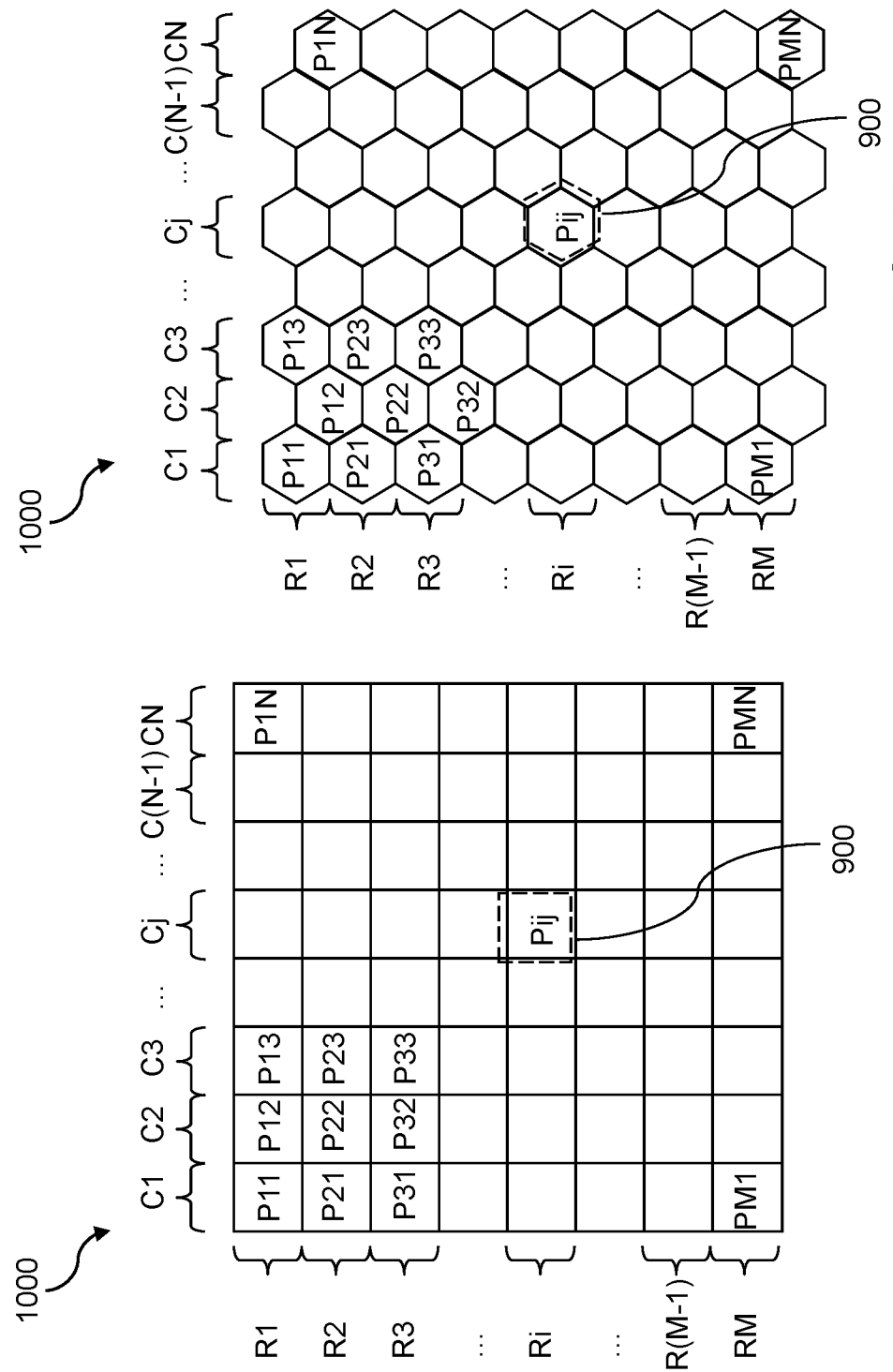

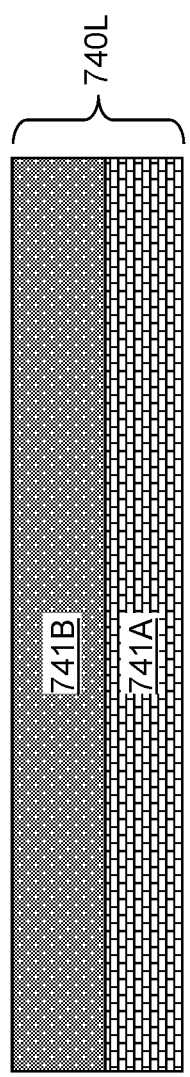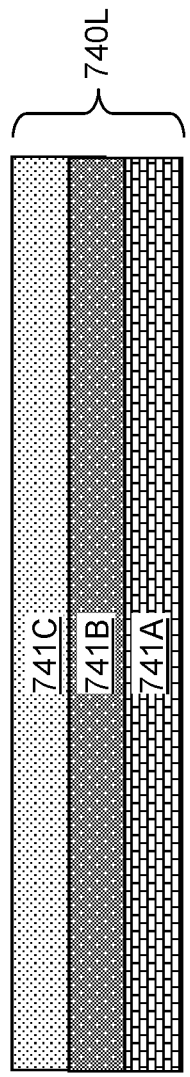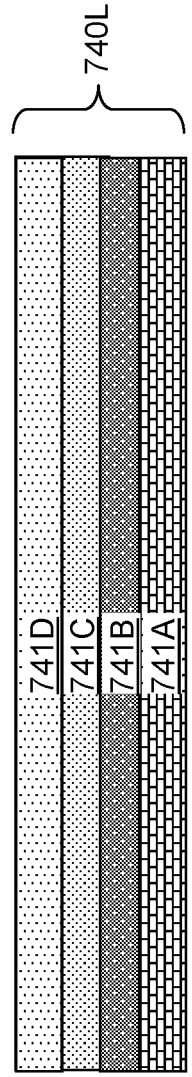

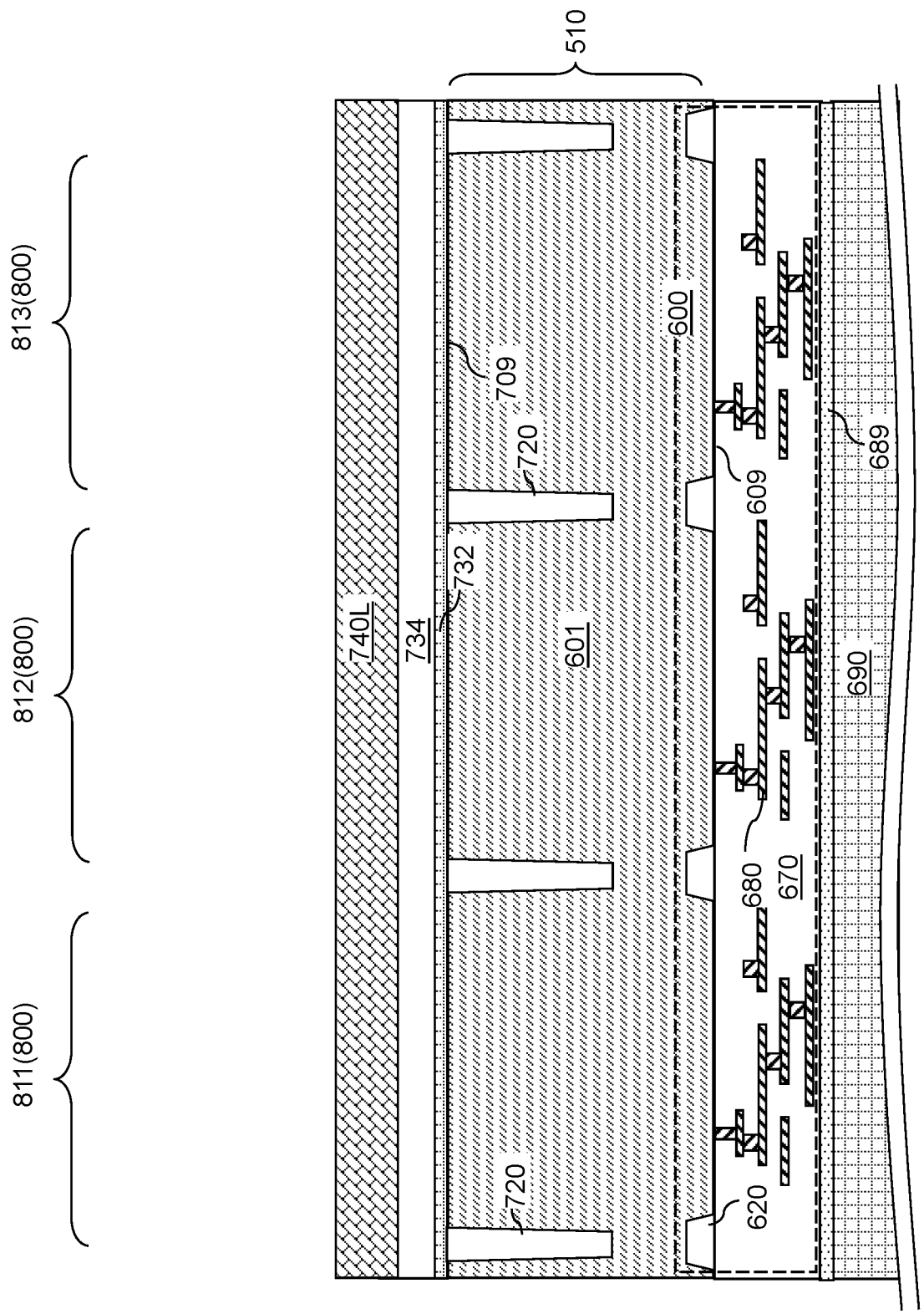

OPTICAL BLOCKING STRUCTURES FOR BLACK LEVEL CORRECTION PIXELS IN AN IMAGE SENSOR

RELATED APPLICATIONS

This application is a divisional application of U.S. application Ser. No. 17/191,393 entitled "Optical Blocking Structures for Black Level Correction Pixels in an Image Sensor," filed on Mar. 3, 2021, the entire contents of which are incorporated herein by reference.

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or embedded cameras in mobile devices. These devices utilize an array of pixels (which may include photodiodes and transistors) to detect radiation using photogeneration of electron-hole pairs. Black level correction pixels are used to measure the level of background current in a photodetector due to thermal noise in the absence of light. However, prior art light blocking materials have significant light leakage, and compromises accuracy of the thermal background current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plan view of a first configuration for an array of pixels of an image sensor according to an embodiment of the present disclosure.

FIG. 1B is a plan view of a second configuration for an array of pixels of an image sensor according to another embodiment of the present disclosure.

FIG. 7A is a vertical cross-sectional view of a first configuration of the light blocking material layer of FIGS. 6A and 6B.

FIG. 7B is a vertical cross-sectional view of a second configuration of the light blocking material layer of FIGS. 6A and 6B.

FIG. 7C is a vertical cross-sectional view of a third configuration of the light blocking material layer of FIGS. 6A and 6B.

FIG. 8C is a vertical cross-sectional view of the black level correction (BLC) pixel region of the exemplary structure at the processing step of FIGS. 8A and 8B according to an embodiment of the present disclosure.

DETAILED DESCRIPTION

Figure 2A:
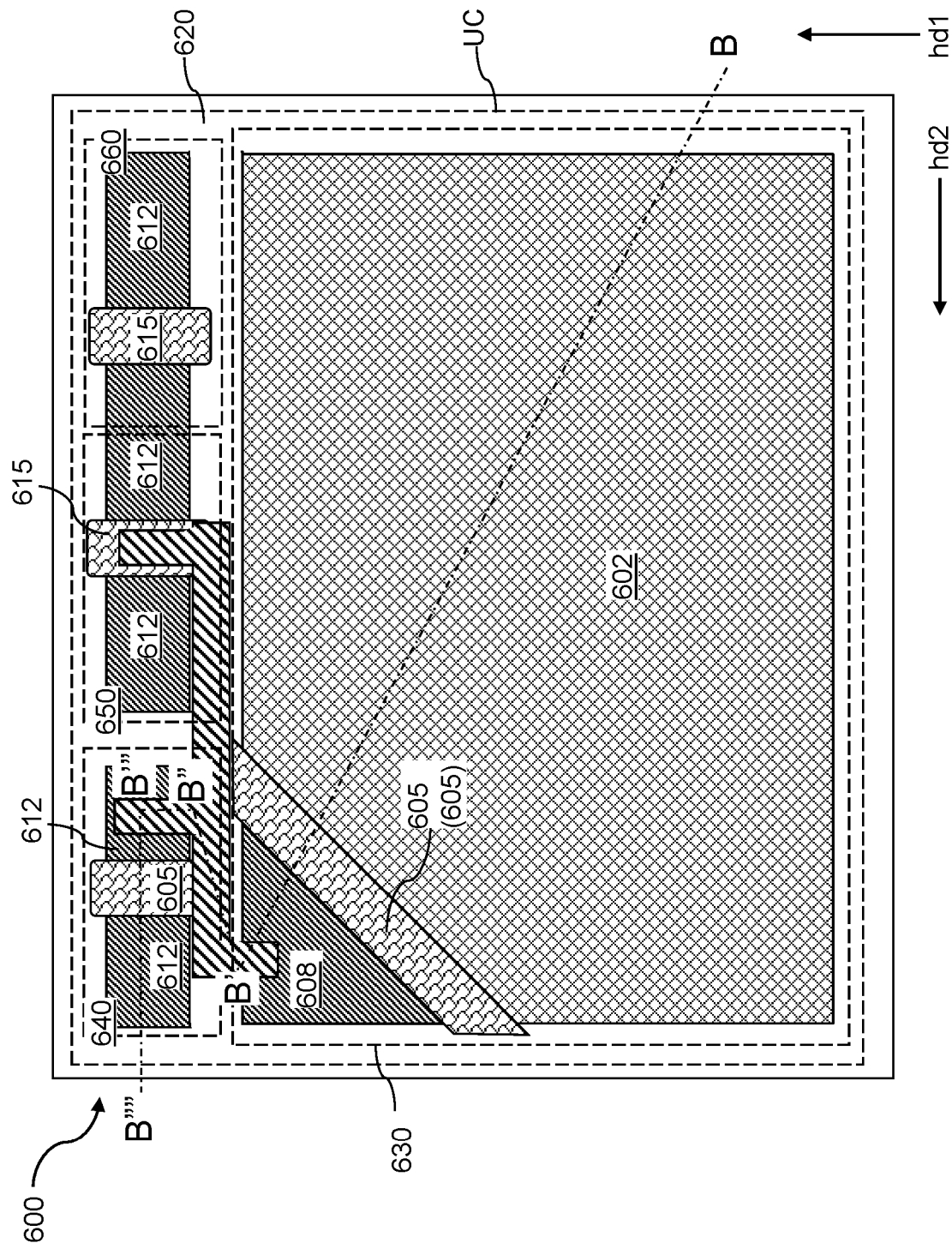
FIG. 2A is a plan view of front-side sensor components within the area of a subpixel in an exemplary structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to an image sensor using optical blocking structures for black level correction pixels and methods of forming the same.

Generally, the structures and methods of the present disclosure may be used to provide enhanced black level correction for a complementary metal-oxide-semiconductor (CMOS) image sensor. At least one light blocking structure is provided within the BLC pixel optics assembly for each black level correction (BLC) pixel to suppress penetration of light that is not blocked by a planar light blocking layer. The at least one light blocking structure may be a composite structure including at least two different material layers. The at least one light blocking structure may include a layer stack including a vertically alternating sequence of first material layers having a first refractive index and second material layers having a second refractive index. The refractive indices and the thicknesses of the materials of the vertically alternating sequence may be tailored to block light in a specific wavelength range that is not blocked by the planar light blocking layer. Additionally or alternatively, the at least one light blocking structure may include at least two metal layers that have a respective wavelength sub-range having a greater reflectivity than another metal layer. Additionally or alternatively, the at least one light blocking structure may include an infrared blocking material layer that provides a higher absorption coefficient than color filter materials within image pixel optics assemblies. The various features and aspects of the methods and structures of the present disclosure are now described with reference to the drawings of the instant application.

Referring to FIGS. 1A and 1B, a first configuration for an array 1000 of pixels 900 of an image sensor and a second configuration of an array 1000 of pixels 900 of an image sensor are illustrated in a respective plan view. The image sensor may be a backside illuminated (BSI) image sensor device. However, it should be appreciated that embodiments of the disclosure may be used in a front-side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to 216, such as from 28 to 214. The rows of pixels 900 may be consecutively numbered with integers that range from 1 to M, and the columns of pixels 900 may be consecutively numbered with integers that range from 1 to N. A pixel $P_{ij}$ refers to a pixel 900 in the i-th row and in the j-th column.

Each pixel 900 includes at least one photodetector that is configured to detect radiation of a given wavelength range. Each pixel 900 may include a plurality of photodetectors configured to detect radiation of a respective wavelength range, which may be different from each of the plurality of photodetectors. In one embodiment, each pixel 900 may include a plurality of subpixels, each of which including a respective combination of a photodetector and an electronic circuit configured to detect radiation that impinged into the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information in impinging radiation for a unit detection area. A subpixel generates information on the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complimentary metal-oxide-semiconductor (CMOS) image sensors, charged coupling device (CCD) sensors, active sensors, passive sensors, other applicable sensors, or a combination thereof.

A predominant subset of the pixels 900 within each array 1000 of pixels 900 of an image sensor comprises image pixels, which are pixels that are used to generate a two-dimensional image. Another subset of the pixels 900 within each array 1000 of pixels 900 of the image sensor may comprise black level correction (BLC) pixels, which are pixels that are used to determine the black level correction signals. Generally, each subpixel within a BLC pixel measures the electrical charges that accumulate within a respective photodiode region in the absence of impinging light. In one embodiment, the BLC pixels may be arranged around the frame of the array 1000 of pixels 900 of the image sensor. In an illustrative example, the BLC pixels may include the first row pixels (such as pixels $P_{1j}$ in which the index j varies from 1 to N), the last row pixels (such as the M-th row pixels $P_{Mj}$ in which the index j varies from 1 to N), the first column pixels (such as pixels $P_{i1}$ in which the index i varies from 1 to M), and the last column pixels (such as pixels $P_{iN}$ in which the index i varies from 1 to M).

In practice, blocking of all impinging light within the entire wavelength range over which the photodetectors of the BLC pixels are active is very difficult. Typically, a single light blocking material layer provides reflectivity significantly less than 100% over a wavelength sub-range and/or has a peak wavelength around which significant transmission of light occurs. As will be explained below, the light blocking structures of the present disclosure use at least two light blocking material layers configured to more effectively block light than any single light blocking material layer.

Figure 2B:
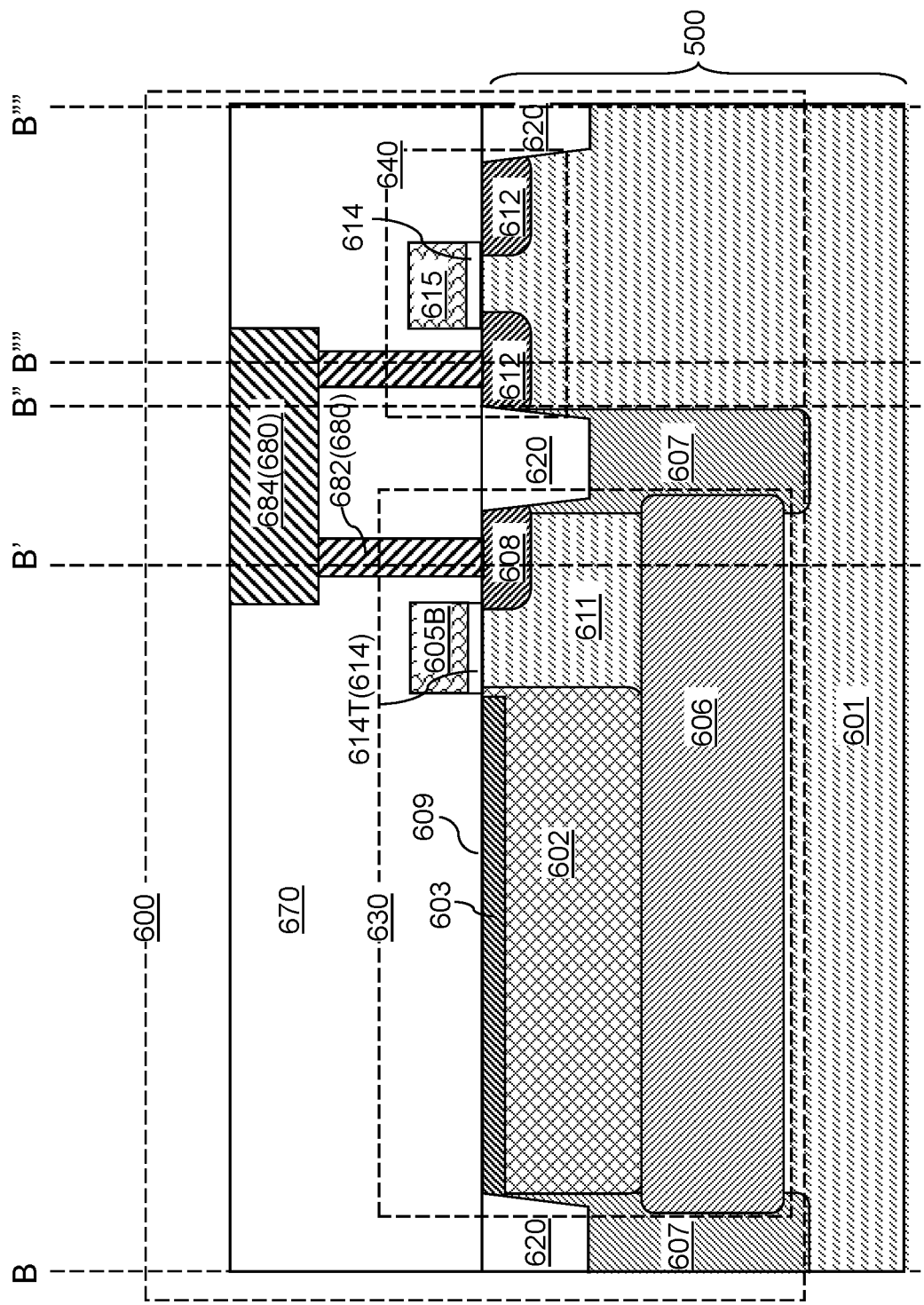
FIG. 2B is a vertical cross-sectional view of the exemplary structure along the hinged vertical plane B-B'-B"-B'"-B"" of FIG. 2A.

Referring to FIGS. 2A and 2B, a photodetector circuit in an exemplary structure is illustrated, which includes a set of front-side sensor components 600 within the area of a subpixel. Front-side sensor components 600 refer to all components of the image sensor that may be formed on the front surface 609 of a semiconductor substrate 500, or may be formed within the substrate semiconductor layer 601. The photodetector circuit includes a photodetector (comprising a transfer transistor 630) and a sensing circuit (640, 650, 660) that includes a reset transistor 640, a source follower transistor 650, and a select transistor 660.

Each subpixel includes a respective photodetector circuit, which includes a subset of the front-side sensor components 600 that may be located within the area of a subpixel. A set of at least one subpixel 800 may be used for a pixel 900. Each subpixel comprises a unit cell ("UC"), which may be repeated along at least one horizontal direction to provide front-side sensor components 600 for a single pixel, which may include a single subpixel, two subpixels, or three or more subpixels. In one embodiment, multiple instances of the unit cell UC may be repeated along at least one horizontal direction. For example, the unit cell UC may be repeated as a two-dimensional array of unit cells UC that are replicated with a first periodicity along a first horizontal direction hd1 and with a second periodicity along a second horizontal direction hd2. As discussed above with reference to FIGS. 1A and 1B, the two-dimensional array may be a rectangular array or a hexagonal array. As such, the second horizontal direction hd2 may, or may not, be perpendicular to the first horizontal direction hd1.

Referring back to FIGS. 2A and 2B, the semiconductor substrate 500 includes a substrate semiconductor layer 601. Each subpixel may be formed on, or in, the substrate semiconductor layer 601, which has a front surface 609 and a back surface. The substrate semiconductor layer 601 includes a semiconductor material such as silicon, germanium, a silicon-germanium alloy, a compound semiconductor material, or another semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step has a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitably doped to have a first conductivity type, which may be p-type or n-type. For example, an epitaxial semiconductor deposition process may be performed to form a single crystalline epitaxial semiconductor material layer at an upper portion of the substrate semiconductor layer such that the atomic concentration of the dopants of the first conductivity type is in a range from $1.0 \times 10^{13}/cm^3$ to $1.0 \times 10^{16}/cm^3$, although lesser and greater atomic concentrations may also be used. The thickness of the single crystalline epitaxial semiconductor material layer may be in a range from 1 micron to 10 microns.

First-conductivity-type wells 607 may be formed by ion implantation around regions in which shallow trench isolation structures 620 may be subsequently formed. The atomic concentration of dopants of the first conductivity type in the first-conductivity-type wells 607 may be in a range from $1.0 \times 10^{15}/cm'$ to $1.0 \times 10^{18}/cm^3$, although lesser and greater atomic concentrations may also be used. Shallow trench isolation structures 620 may be formed to provide electrical isolation to and from the various components within the subpixel.

Dopants of a second conductivity type may be implanted through the front surface 609 of the semiconductor substrate 500 using at least one masked ion implantation process. The second conductivity type is the opposite of the first conductivity type. For example, if the first conductivity type is p-type, the second conductivity type is n-type, and vice versa. Various doped regions having a doping of the second conductivity type is formed by the at least one masked ion implantation process. A second-conductivity-type photodiode layer 602 may be formed underneath the front surface 609 of the semiconductor substrate 500 in each unit cell UC such that a periphery of the second-conductivity-type photodiode layer 602 overlaps with an edge of the transfer gate electrode 605 in a plan view. The lateral extent of the second-conductivity-type photodiode layer 602 may be limited to one side of a transfer gate electrode to be subsequently formed. Thus, the edge of the second-conductivity-type photodiode layer 602 may be laterally spaced from the shallow trench isolation structures 620 by a region in which a transfer gate electrode and a floating diffusion region may be subsequently formed.

A buried second-conductivity-type photodiode layer 606 may be formed underneath the second-conductivity-type photodiode layer 602 at the depth of the bottom portions of the first-conductivity-type wells 607 by implanting dopants of the second conductivity type with a higher implantation energy than during the implantation process that forms the second-conductivity-type photodiode layer 602. The buried second-conductivity-type photodiode layer 606 may adjoin the first-conductivity-type wells 607. In one embodiment, each buried second-conductivity-type photodiode layer 606 may have a periphery that adjoins the first-conductivity-type wells 607.

In one embodiment, the depth of the top surface of the buried second-conductivity-type photodiode layer 606 may be in a range from 400 nm to 1,500 nm, although lesser and greater depths may also be used. In one embodiment, the depth of the bottom surface of the buried second-conductivity-type photodiode layer 606 may be in a range from 800 nm to 2,500 nm, although lesser and greater depths may also be used.

The unimplanted portion of the substrate semiconductor layer 601 that overlies the buried second-conductivity-type photodiode layer 606 may have a doping of the first conductivity type, and may be subsequently used as a body region of a transfer transistor. As such, the unimplanted portion of the substrate semiconductor layer 601 that overlies the buried second-conductivity-type photodiode layer 606 is herein referred to as a transfer transistor body region 611. In one embodiment, the buried second-conductivity-type photodiode layer 606 may have the same lateral extent as a transfer transistor 630 to be subsequently formed, and may coincide with the portion of the shallow trench isolation structure 620 that encircles the combination of the second-conductivity-type photodiode layer 602 and the transfer transistor body region 611.

Gate stack structures (614, 605, 615) may be formed over the front surface 609 of the semiconductor substrate 500 by depositing and patterning a layer stack including a gate dielectric layer and a gate electrode layer. Each patterned portion of the layer stack constitutes a gate stack structure (614, 605, 615), which may be a transfer gate stack structure (614T, 605) and a control gate stack structure (614, 615). Each transfer gate stack structure (614T, 605) includes a gate dielectric, which is herein referred to as a transfer gate dielectric 614T, and a gate electrode, which is herein referred to as a transfer gate electrode 605. Each transfer gate stack structure (614T, 605) is located between the second-conductivity-type photodiode layer 602 and the floating diffusion region 608. Each control gate stack structure (614, 615) includes a gate dielectric 614 and a gate electrode 615.

Each of the control gate stack structures (614, 615) includes a respective layer stack of a gate dielectric 614 and a gate electrode 615 of other transistors in a sensing circuit, which may include a reset transistor 640, a source follower transistor 650, a select transistor 660, and other suitable transistors that may be used to amplify the signal generated by the photodetector of the subpixel.

Various active regions (608, 612) having a doping of the second conductivity type may be formed. The various active regions (608, 612) may include a floating diffusion region 608 that functions as the drain region of the transfer transistor 630. Current flow between the second-conductivity-type photodiode layer 602 and the floating diffusion region 608 may be controlled by the transfer gate electrode 605.

The second-conductivity-type photodiode layer 602 may accumulate electrical charges (such as electrons in embodiments in which the second conductivity type is n-type) during sensing (i.e., while the subpixel actively detects the photons impinging thereupon, for example, for the purpose of taking a frame or a photo) and may function as the source region of the transfer transistor 630. The active regions 612 include source regions and drain regions of the various transistors (640, 650, 660) in the sensing circuit. The floating diffusion regions 608 may be vertically spaced from the buried second-conductivity-type photodiode layer 606 by the transfer transistor body region 611.

The floating diffusion region 608 and the active regions 612 of each unit cell UC may be formed by ion implantation of dopants of the second conductivity type using masked ion implantation processes. The combination of a respective patterned photoresist layer and the gate stack structures (614, 605, 615) may be used ion implantation blocking structures (i.e., masking structures) during the ion implantation processes. The depth of the bottom surface of the floating diffusion regions 608 may be in a range from 100 nm to 400 nm, such as from 150 nm to 250 nm, although lesser and greater depths may also be used. The depth of the bottom surfaces of the active regions 612 may be in a range from 100 nm to 600 nm, such as from 150 nm to 400 nm, although lesser and greater depths may also be used.

A first-conductivity-type pinning layer 603 may be formed directly on top of the second-conductivity-type photodiode layer 602 by ion implantation of dopants of the first conductivity type. The first-conductivity-type pinning layer 603 suppresses depletion of the interface between the second-conductivity-type photodiode layer 602 and the first-conductivity-type pinning layer 603, and electrically stabilizes the second-conductivity-type photodiode layer 602. The first-conductivity-type pinning layer 603 is omitted in all of the top-down views of the various exemplary structures of the present disclosure in order to clearly illustrate the lateral extent of the second-conductivity-type photodiode layer 602 that underlies the first-conductivity-type pinning layer 603. The depth of the p-n junction between the first-conductivity-type pinning layer 603 and the second-conductivity-type photodiode layer 602 may be in a range from 5 nm to 100 nm, although lesser and greater depths may also be used. The first-conductivity-type pinning layer 603 forming an additional p-n junction with the second-conductivity-type photodiode layer 602 in addition to the p-n junction between the second-conductivity-type photodiode layer 602 and the substrate semiconductor layer 601.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various metal line structures 684. For example, each of the floating diffusion regions 608 may be connected to the gate electrode 615 of a respective source follower transistor 650 by a subset of the metal interconnect structures 680. A photodetector may comprise a transfer transistor 630, and may be connected to a sense circuit including additional transistors (640, 650, 660).

The sensing circuit (640, 650, 660) includes a set of a reset transistor 640, a source follower transistor 650, and a select transistor 660. Generally, the sensing circuit (640, 650, 660) of each subpixel may be provided within the area of the unit cell UC. In one embodiment, each interconnected sets of transistors (640, 650, 660) of the sensing circuit may be arranged side by side within an area of a respective strip located in proximity to an edge of the unit cell UC and extending along the entire length of a side of the unit cell UC or along at least 30% of the length of the side of the unit cell UC. In another embodiment, each interconnected sets of transistors (640, 650, 660) of the sensing circuit may be arranged around the floating diffusion region 608 of the transfer transistor 630 within an area of a block located in proximity to a corner of the unit cell UC.

The exemplary structure includes image pixels and black level correction (BLC) pixels. Each subpixel within the BLC pixels may have an identical structure as a subpixel within the image pixels in order to provide accurate estimation of black level correction electrical charges, i.e., the amount of electrical charges that a photodetector circuit gathers in the absence of impinging radiation, for example, due to thermal noises.

Figure 3:
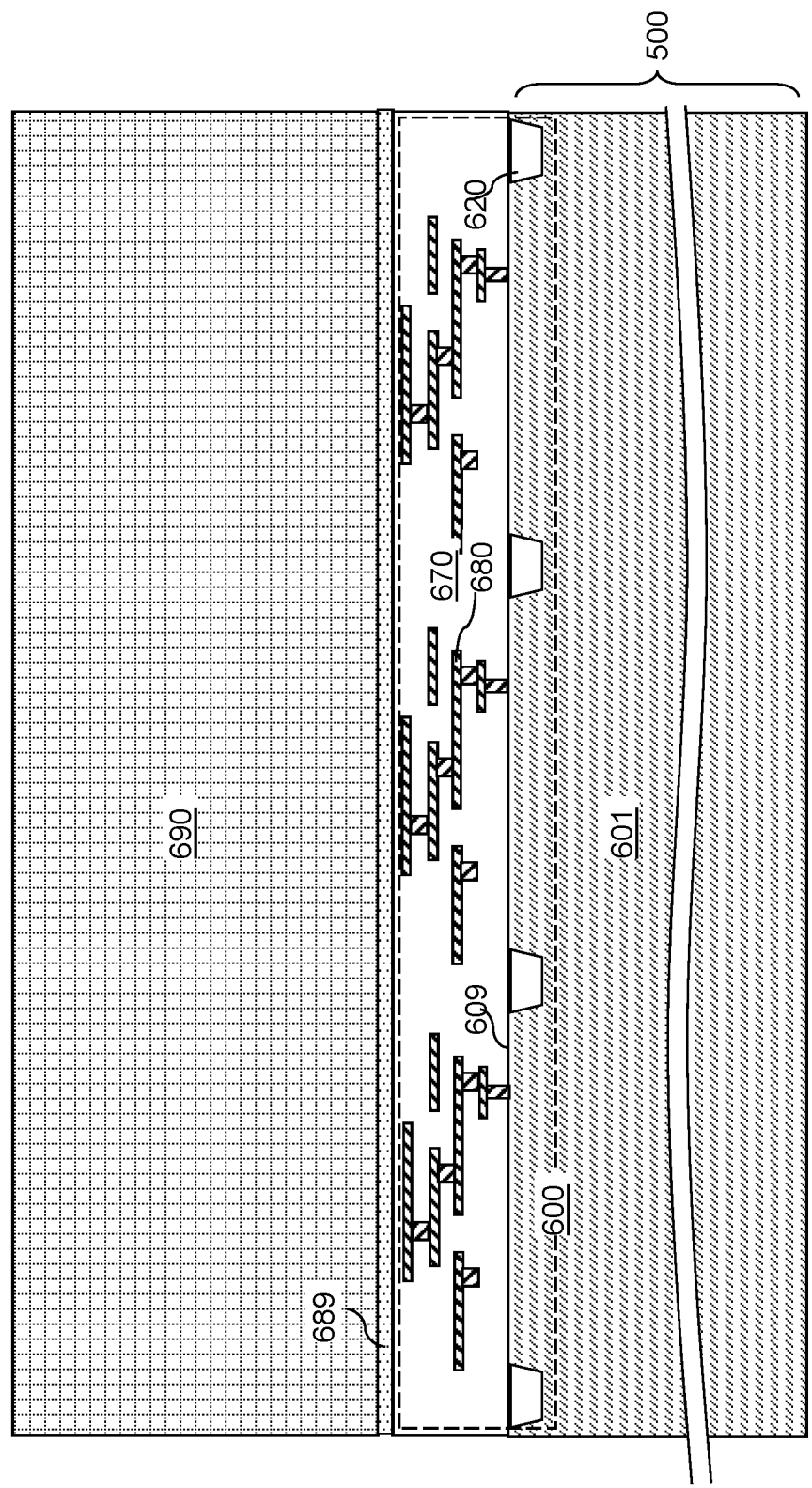
FIG. 3 is a vertical cross-sectional view of the exemplary structure after formation of metal interconnect structures formed within interconnection-level dielectric layers and attachment of a carrier substrate according to an embodiment of the present disclosure.

Referring to FIG. 3, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 may be temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 510 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690.

Figure 4:
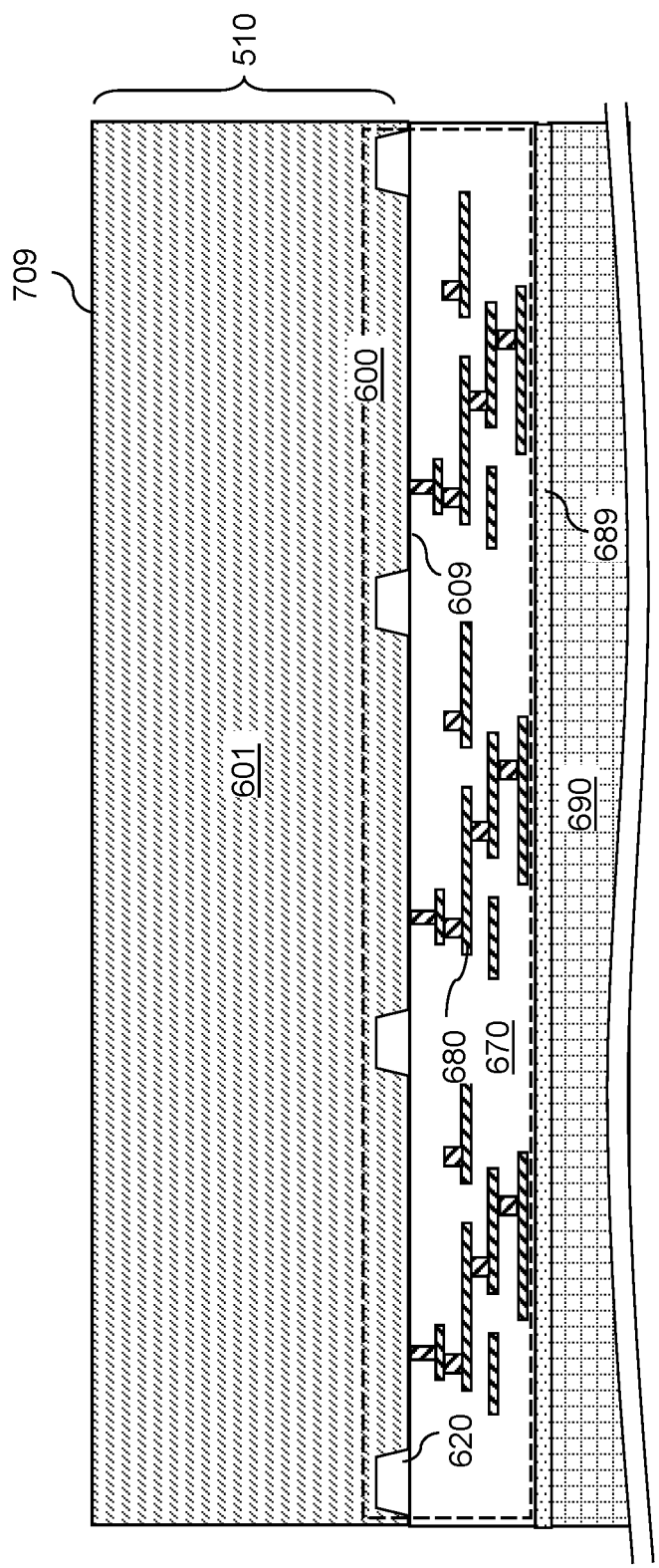
FIG. 4 is a vertical cross-sectional view of the exemplary structure after thinning a semiconductor substrate according to an embodiment of the present disclosure.

Referring to FIG. 4, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns. The semiconductor substrate 500 as thinned after the thinning process is herein referred to as a thinned semiconductor substrate 510, or as a semiconductor substrate 510. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 5:
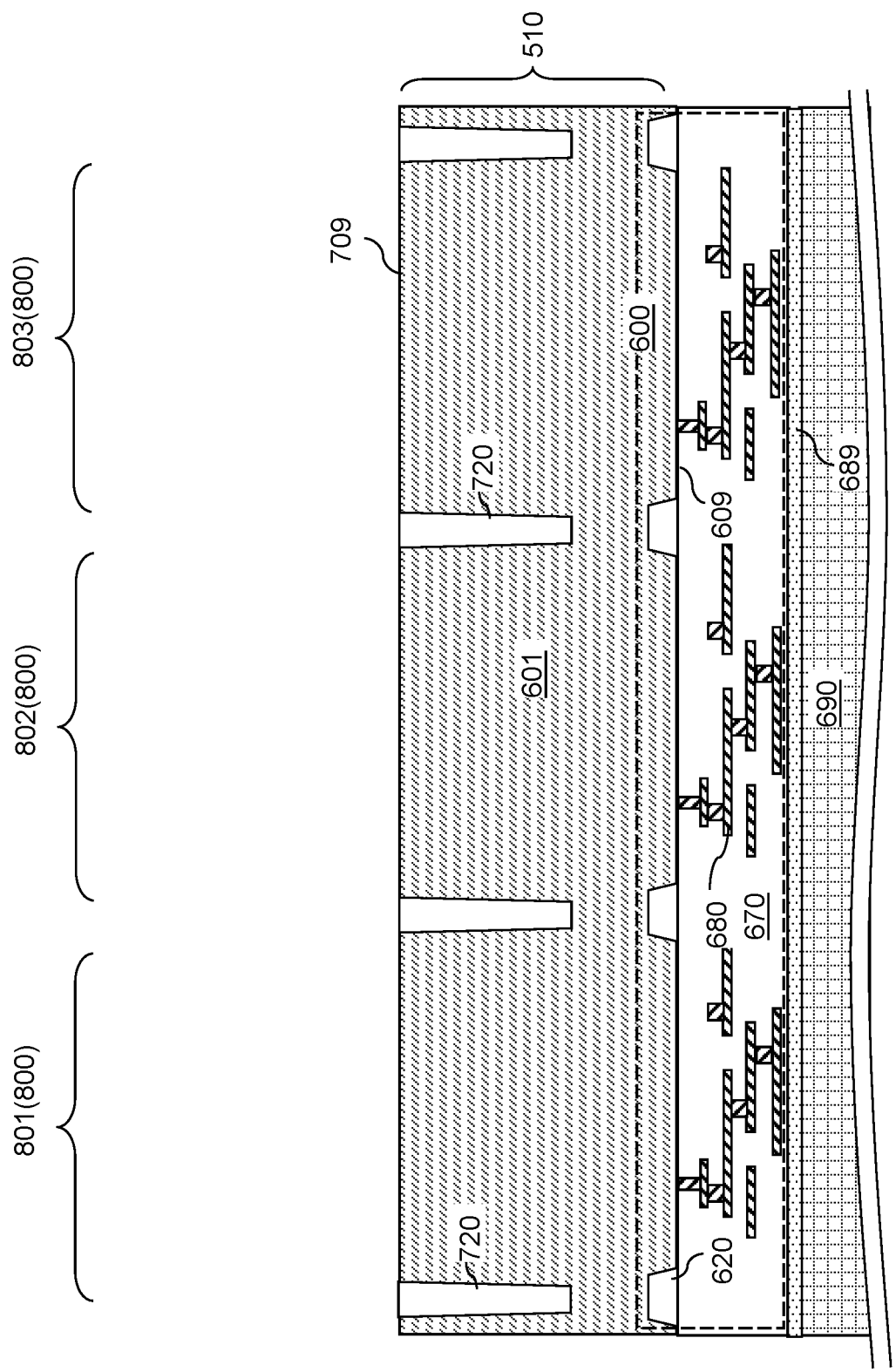
FIG. 5 is a vertical cross-sectional view of the exemplary structure after formation of deep trench isolation structures according to an embodiment of the present disclosure.

Referring to FIG. 5, a photoresist layer (not shown) may be applied over the backside surface 709 of the thinned semiconductor substrate 510, and may be lithographically patterned to form openings that generally replicate the pattern of the shallow trench isolation structures 620 located underneath. Unmasked portions of the semiconductor substrate 510 may be etched by performing an anisotropic etch process, which transfers the pattern of the openings in the photoresist layer into the semiconductor substrate 510. The depth of the deep trenches may be in a range from 1 micron to 10 microns, such as from 1.5 microns to 8 microns. Deep trenches may be formed in the semiconductor substrate 510. The photoresist layer may be subsequently removed, for example, by ashing.

At least one dielectric material such as silicon oxide may be deposited in the deep trenches. Excess portions of the at least one dielectric material overlying the backside surface 709 of the thinned semiconductor substrate 510 may be removed by a planarization process. The planarization process may include a chemical mechanical planarization (CMP) process and/or a recess etch process. Remaining portions of the at least one dielectric material filling the deep trenches comprise deep trench isolation structures 720.

The deep trench isolation structures 720 may define areas for subpixels 800. Each subpixel 800 may be located within a respective subpixel region, which is located within a region of a pixel, i.e., within a pixel region. For example, an area of an image pixel may include an area of a first subpixel 801, an area of a second subpixel 802, and an area of a third subpixel 803. In an illustrative example, the first subpixel 801 may be formed in a region that includes a photodetector configured to detect green light, the second subpixel 802 may be formed in a region that includes a photodetector configured to detect red light, and the third subpixel 803 may be formed in a region that includes a photodetector configured to detect blue light. Each subpixel 800 may include a volume containing a patterned columnar portion of the semiconductor substrate 510 that is laterally enclosed by a connected set of deep trenches. A pixel region of a pixel includes all subpixel regions for the set of subpixels 800 contained within the pixel. Each black level correction (BLC) pixel includes at least one subpixel. In one embodiment, each BLC pixel may include the same number of subpixels as an image pixel. In an illustrative example, if an image pixel includes a first subpixel 801, a second subpixel 802, and a third subpixel 803, a BLC pixel may include a first BLC subpixel, a second BLC subpixel, and a third BLC subpixel.

Figure 6A:
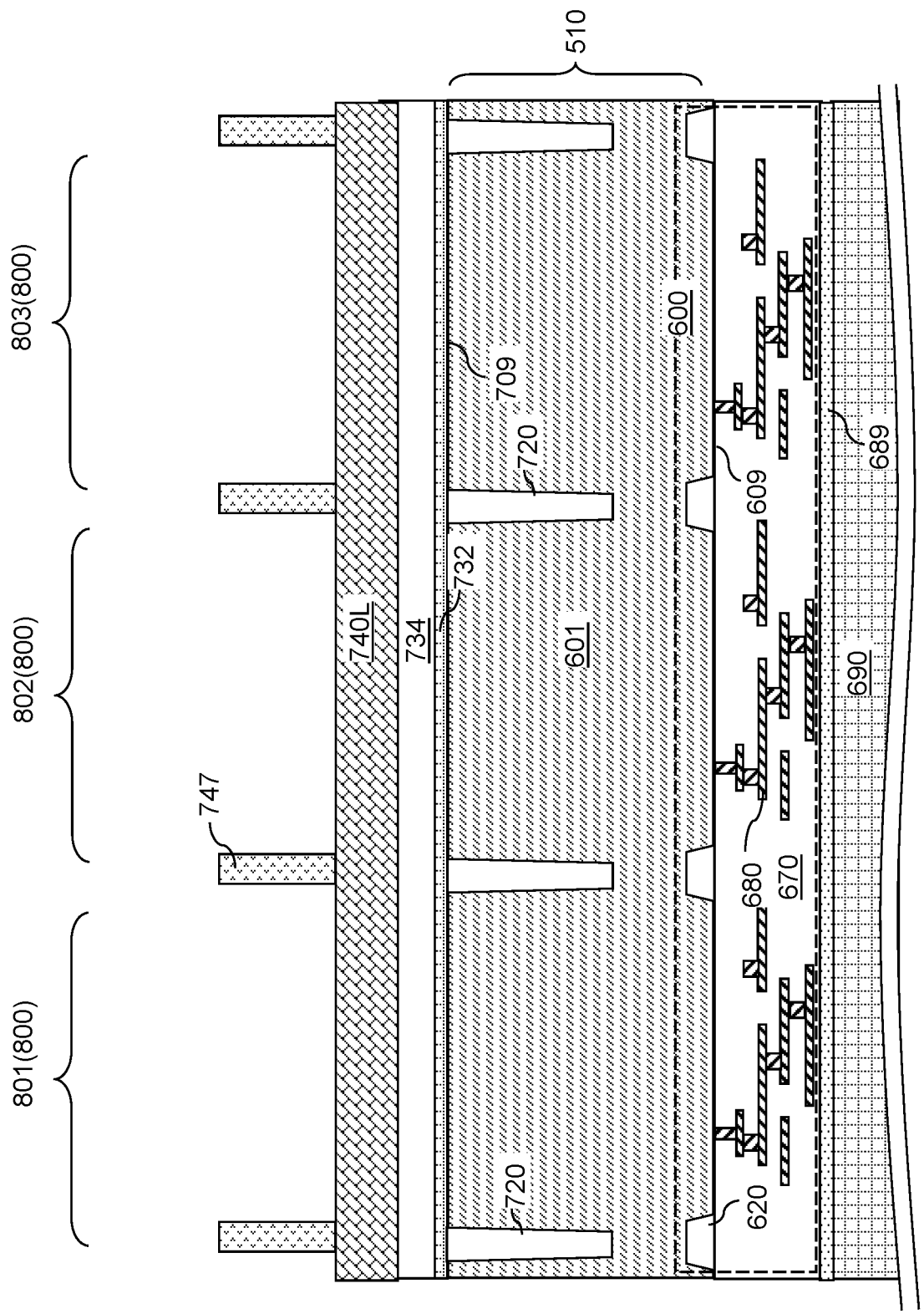
FIG. 6A is a vertical cross-sectional view of an image pixel region of the exemplary structure after formation of an antireflective coating (ARC) layer, a proximal dielectric layer, a light blocking material layer, and a patterned photoresist layer according to an embodiment of the present disclosure.
Figure 6B:
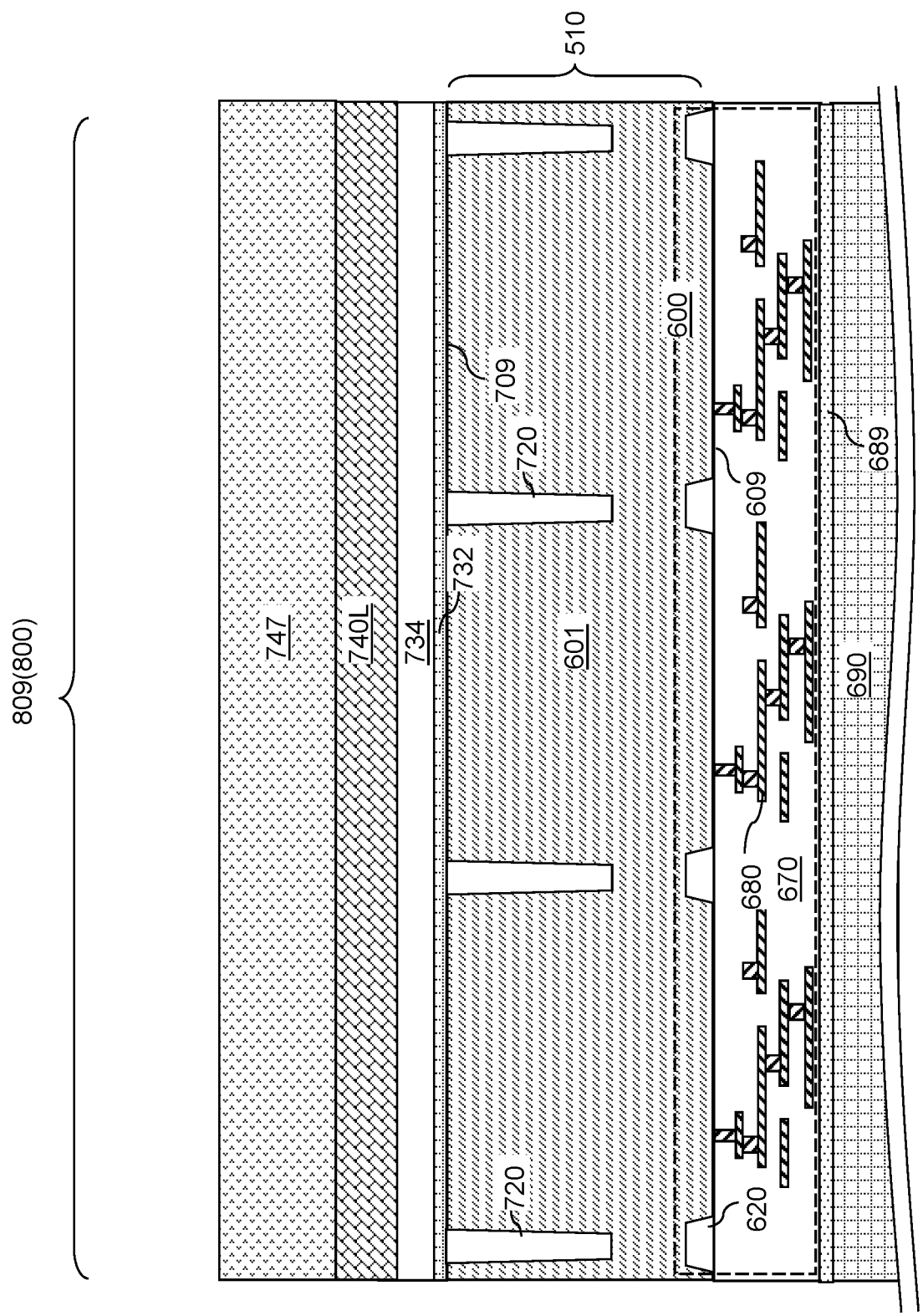
FIG. 6B is a vertical cross-sectional view of a black level correction (BLC) pixel region of the exemplary structure at the processing step of FIG. 6A according to an embodiment of the present disclosure.

Referring to FIGS. 6A and 6B, an optional antireflective coating (ARC) layer 732, a proximal dielectric layer 734, and a light blocking material layer 740L may be sequentially deposited over the backside surface 709 of the semiconductor substrate 510.

The optional ARC layer 732 includes an antireflective coating material that reduces reflection between the semiconductor material of the semiconductor substrate 510 and the overlying material layer, i.e., the proximal dielectric layer 734. The optional ARC layer 732 may include a single material layer or a layer stack of multiple layers having gradually changing refractive indices. In one embodiment, the optional ARC layer 732 includes a semiconductor material such as polysilicon, polycrystalline germanium, a silicon-germanium alloy, or a III-V compound semiconductor material. The ARC layer 732 may have a thickness in a range from 50 nm to 300 nm, although lesser and greater thicknesses may also be used.

The proximal dielectric layer 734 may include a dielectric material such as silicon oxide, silicon oxynitride, silicon nitride, or a dielectric metal oxide (e.g., aluminum oxide). The thickness of the proximal dielectric layer 734 may be in a range from 100 nm to 1,000 nm, although lesser and greater thicknesses may also be used.

The light blocking material layer 740L of the present disclosure may be a composite light blocking material layer including at least two different material layers. The light blocking material layer 740L of the present disclosure may include various material layers stacks as illustrated in FIGS. 7A-7E. FIGS. 7A-7E illustrate various configurations of the light blocking material layer 740L that may be used in the exemplary structure of FIGS. 6A and 6B.

Referring to FIGS. 7A-7C, the light blocking material layer 740L may include at least two metal layers (741A, 741B, 741C, 741D). FIG. 7A illustrates a first configuration in which the light blocking material layer 740L consists of two metal layers (741A, 741B) that include a first metal layer 741A and a second metal layer 741B. FIG. 7B illustrates a second configuration in which the light blocking material layer 740L consists of three metal layers (741A, 741B, 741C) that include a first metal layer 741A, a second metal layer 741B, and a third metal layer 741C. FIG. 7C illustrates a third configuration in which the light blocking material layer 740L consists of four metal layers (741A, 741B, 741C, 741D) that include a first metal layer 741A, a second metal layer 741B, a third metal layer 741C, and a fourth metal layer 741D. Each of the at least two metal layers (741A, 741B, 741C, 741D) in the light blocking material layer 740L comprises a respective wavelength sub-range having a greater reflectivity than another metal layer selected from the at least two metal layers (741A, 741B, 741C, 741D) within a wavelength range from 200 nm to 1,600 nm.

In some embodiments, one of the at least two metal layers (741A, 741B, 741C, 741D) comprises, and/or consists of, a refractory metal layer, and another of the at least two metal layers (741A, 741B, 741C, 741D) comprises, and/or consists of, a layer selected from a gold layer, a silver layer, a copper layer, and an aluminum layer. The refractory metal layer may consist essentially of a single refractory metal, which may be any of tungsten, niobium, molybdenum, tantalum, rhenium, titanium, vanadium, chromium, zirconium, hafnium, ruthenium, rhodium, osmium, and iridium. Alternatively, the refractory metal layer may consist essentially of an intermetallic alloy of at least two refractory metals, i.e., any alloy of at least two metals selected from tungsten, niobium, molybdenum, tantalum, rhenium, titanium, vanadium, chromium, zirconium, hafnium, ruthenium, rhodium, osmium, and iridium. Other suitable materials are within the contemplated scope of disclosure.

Alternatively or additionally, the at least two metal layers (741A, 741B, 741C, 741D) may comprise at least two layers selected from a gold layer, a silver layer, a copper layer, and an aluminum layer. In one embodiment, the refractory metal layer may be a tungsten layer consisting essentially of tungsten. Other suitable materials are within the contemplated scope of disclosure.

In the first configuration for the light blocking material layer 740L, the light blocking material layer 740L may consist of two metal layers (741A, 741B), and one of the two metal layers (741A, 741B) may be a refractory metal layer, and another of the two metal layers (741A, 741B) may be a layer selected from a gold layer, a silver layer, a copper layer, and an aluminum layer. Alternatively, the first metal layer 741A and the second metal layer 741B may be two different layers selected from a gold layer, a silver layer, a copper layer, and an aluminum layer.

In the second configuration for the light blocking material layer 740L, the light blocking material layer 740L may consist of three metal layers (741A, 741B, 741C), and the three metal layers (741A, 741B, 741C) may include one or two refractory metal layers, and the remaining metal layer(s) may be selected from a gold layer, a silver layer, a copper layer, and an aluminum layer. Alternatively, the three metal layers (741A, 741B, 741C) may be at least two different metal layers selected from a gold layer, a silver layer, a copper layer, and an aluminum layer. The three metal layers (741A, 741B, 741C) may, or may not, include two layers of a same metal.

In the third configuration for the light blocking material layer 740L, the light blocking material layer 740L may consist of four metal layers (741A, 741B, 741C, 741D), and the four metal layers (741A, 741B, 741C, 741D) may include one, two, or three refractory metal layers, and the remaining metal layer(s) may be selected from a gold layer, a silver layer, a copper layer, and an aluminum layer. Alternatively, the four metal layers (741A, 741B, 741C, 741D) may be at least two different metal layers selected from a gold layer, a silver layer, a copper layer, and an aluminum layer. The four metal layers (741A, 741B, 741C) may, or may not, include two layers of a same metal.

While the present disclosure is described using embodiments in which the light blocking material layer 740L includes two, three, or four metal layers (741A, 741B, 741C, 741D), embodiments are expressly contemplated herein in which the light blocking material layer 740L may include five or more metal layers.

Each of the at least two metal layers (741A, 741B, 741C, 741D) in the light blocking material layer 740L may comprise a respective wavelength sub-range having a greater reflectivity than another metal layer selected from the at least two metal layers (741A, 741B, 741C, 741D) within a wavelength range from 200 nm to 1,600 nm. Thus, the first configuration of the light blocking material layer 740L provides a first wavelength sub-range within which the first metal layer 741A provides a higher reflectivity than the second metal layer 741B, and a second wavelength sub-range within which the second metal layer 741B provides a higher reflectivity than the first metal layer 741A. A sub-range refers to an interval within a range that has a lesser width than the width of the entirety of the range. The first wavelength sub-range does not overlap with the second wavelength sub-range.

The second configuration of the light blocking material layer 740L provides a first wavelength sub-range within which the first metal layer 741A provides a higher reflectivity than the second metal layer 741B and/or the third metal layer 741C; a second wavelength sub-range within which the second metal layer 741B provides a higher reflectivity than the first metal layer 741A and/or the third metal layer 741C; and a third wavelength sub-range within which the third metal layer 741C provides a higher reflectivity than the first metal layer 741A and/or the second metal layer 741B. The first wavelength sub-range, the second wavelength sub-range, and the third wavelength sub-range may not have any mutual overlap in case the material compositions of the three metal layers (741A, 741B, 741C) are different from one another.

The third configuration of the light blocking material layer 740L provides a first wavelength sub-range within which the first metal layer 741A provides a higher reflectivity than the second metal layer 741B, the third metal layer 741C, and/or the fourth metal layer 741D; a second wavelength sub-range within which the second metal layer 741B provides a higher reflectivity than the first metal layer 741A, the third metal layer 741C, and/or the fourth metal layer 741D; a third wavelength sub-range within which the third metal layer 741C provides a higher reflectivity than the first metal layer 741A, the second metal layer 741B, and/or the fourth metal layer 741D; and a fourth wavelength sub-range within which the fourth metal layer 741D provides a higher reflectivity than the first metal layer 741A, the second metal layer 741B, and/or the third metal layer 741C. The first wavelength sub-range, the second wavelength sub-range, the third wavelength sub-range, and the fourth wavelength sub-range do not have any mutual overlap in case the material compositions of the four metal layers (741A, 741B, 741C, 741D) are different from one another.

Each of the at least two metal layers (741A, 741B, 741C, 741D) in the light blocking material layer 740L may have a respective thickness in a range from 30 nm to 600 nm, such as from 60 nm to 300 nm, although lesser and greater thicknesses may also be used.

Table 1 illustrates an example of two different sub-ranges in which an aluminum layer or a gold layer provides a higher reflectivity. In this example, aluminum provides a higher reflectivity in a wavelength sub-range from 200 nm to 550 nm, and gold provide a higher reflectivity in a wavelength sub-range from 600 nm to 1,600 nm.

TABLE 1

Reflectivity of aluminum and gold as a function of wavelength

| Wavelength (nm) | Reflectivity of Al (%) | Reflectivity of Au (%) |
| --- | --- | --- |
| 200 | 75 | 24 |
| 250 | 89 | 28 |
| 300 | 90 | 31 |
| 350 | 91 | 34 |
| 400 | 91 | 37 |
| 450 | 91 | 41 |
| 500 | 90 | 52 |
| 550 | 90 | 81 |
| 600 | 90 | 91 |
| 650 | 89 | 95 |
| 700 | 88 | 96 |
| 750 | 87 | 97 |
| 800 | 86 | 97 |
| 850 | 86 | 97 |
| 900 | 89 | 98 |
| 950 | 91 | 98 |
| 1,000 | 93 | 98 |
| 1,050 | 94 | 98 |
| 1,100 | 94 | 98 |
| 1,150 | 95 | 98 |
| 1,200 | 95 | 98 |
| 1,250 | 95 | 98 |
| 1,300 | 96 | 98 |
| 1,350 | 96 | 98 |
| 1,400 | 96 | 99 |
| 1,450 | 96 | 99 |
| 1,500 | 96 | 99 |
| 1,550 | 96 | 99 |
| 1,600 | 96 | 99 |

Figure 7D:
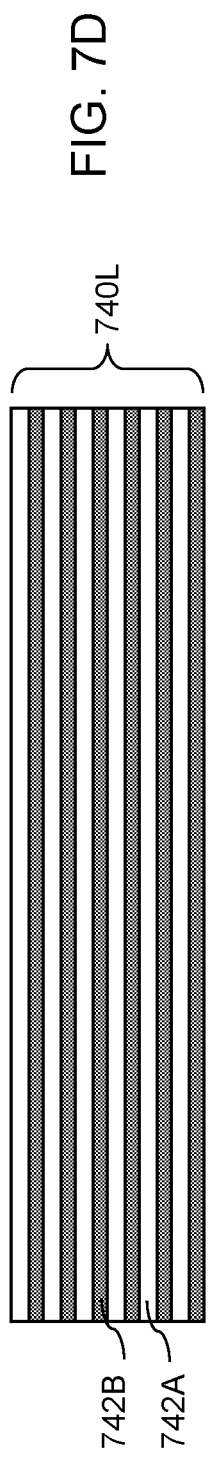
FIG. 7D is a vertical cross-sectional view of a fourth configuration of the light blocking material layer of FIGS. 6A and 6B.

Referring to FIG. 7D, a fourth configuration of the light blocking material layer 740L is illustrated, which includes a vertically alternating sequence of first material layers 742A having a first refractive index and second material layers 742B having a second refractive index. The first material layers 742A and the second material layers 742B alternate along the vertical direction in the vertically alternating sequence (742A, 742B) of the first material layers 742A and the second material layers 742B.

The first material layers 742A in the vertically alternating sequence (742A, 742B) may be repeated at least twice. In other words, at least two first material layers 742A may be present in the vertically alternating sequence (742A, 742B). Likewise, the second material layers 742B in the vertically alternating sequence (742A, 742B) may be repeated at least twice. In other words, at least two second material layers 742B may be present in the vertically alternating sequence (742A, 742B). The total number of repetitions of an adjoined pair of a first material layer 742A and a second material layer 742B within the vertically alternating sequence (742A, 742B) may be in a range from 2 to 20, such as from 3 to 10. The total number of repetitions of the adjoined pair of a first material layer 742A and a second material layer 742B within the vertically alternating sequence (742A, 742B) may be selected to generate a constructive interference pattern for a specific wavelength sub-range such that the reflectivity of light within the wavelength sub-range is in a range from 0.8 to 1.0, such as from 0.9 to 1.0 (e.g., from 0.95 to 1.0).

In one embodiment, the first material layers 742A and/or the second material layers 742B may comprise, and/or may consist essentially of, a respective dielectric metal oxide. In one embodiment, each dielectric metal oxide in the first material layers 742A and/or the second material layers 742B may comprise, and/or may consist essentially of, a material selected from magnesium oxide, aluminum oxide, ytterbium oxide, zinc oxide, tantalum oxide, zirconium oxide, hafnium oxide, tellurium oxide, and titanium oxide. Other suitable materials are within the contemplated scope of disclosure.

In one embodiment, the first material layers 742A and/or the second material layers 742B may comprise, and/or may consist essentially of, a doped silicate glass including at least one dopant element at an atomic percentage in a range from 1% to 50%. In one embodiment, the at least one dopant element may comprise, and/or may consist of, one or more of a combination of calcium and fluorine, boron, barium, phosphorus, lanthanum, and lead. In case a combination of calcium and fluorine is employed as the at least one dopant element, $CaF_2$ may be added to a silicate glass ($SiO_2$) to provide the doped silicate glass. The doped silicate glass may include any of fluorosilicate glass, borosilicate glass, barium-doped silicate glass, lanthanum-doped silicate glass, or lead-doped silicate glass. Alternatively or additionally, titanium oxide and/or aluminum oxide may be added to a silicate glass to form the doped silicate glass material of the first material layers 742A and/or the second material layers 742B. In case the first material layers 742A include a first doped silicate glass material and the second material layers 742B include a second doped silicate glass material, the first doped silicate glass material and the second doped silicate glass material may have different compositions and different refractive indices. All refractive indices discussed herein are measured at the wavelength of 587.56 nm, which is the wavelength of the sodium D line that is used in the art for refractive index measurements.

In one embodiment, the first material layers 742A and/or the second material layers 742B may comprise, and/or may consists essentially of, silicon, doped silicon including dopants at an atomic concentration less than 5%, silicon nitride, silicon oxide, and silicon-rich silicon oxide.

In one embodiment, the first material layers 742A have a first refractive index, the second material layers 742B have a second refractive index that is different from the first refractive index, the first refractive index and the second refractive index are in a range from 1.0 to 4.0, and the difference between the first refractive index and the second refractive index is in a range from 0.1 to 3.0.

In one embodiment, each of the first material layers 742A has a first thickness, each of the second material layers 742B has a second thickness, and the first thickness and the second thickness are in a range from 0.5 nm to 500 nm, such as from 5 nm to 50 nm.

Figure 7E:
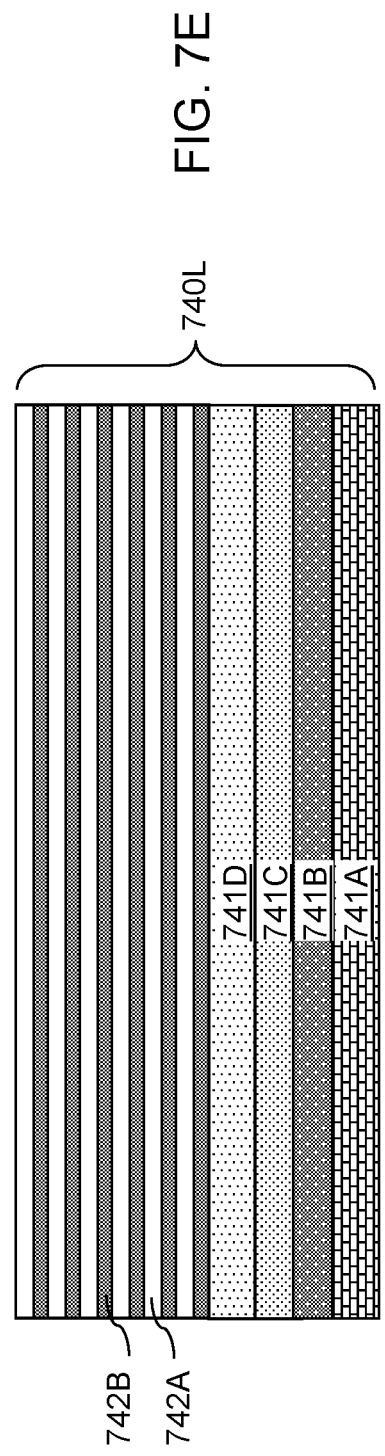
FIG. 7E is a vertical cross-sectional view of a fifth configuration of the light blocking material layer of FIGS. 6A and 6B.

Table 2 provides a list of refractive indices for the materials that may be used for the first material layers 742A and/or the second material layers 742B within the light blocking material layer 740L illustrated in FIG. 7D or FIG. 7E.

TABLE 2

Refractive index of materials that may be used within the light blocking material layer 740L illustrated in FIG. 7D or FIG. 7E.

| Material | Refractive index at 587.56 nm |
| --- | --- |
| $SiO_2$ | 1.5384 |
| SiO | 1.7369 |
| MgO | 1.7455 |
| $Al_2O_3$ | 1.7935 |
| $Yb_2O_3$ | 1.9627 |
| ZnO | 2.0516 |
| $Si_3N_4$ | 2.0634 |
| $Ta_2O_5$ | 2.1587 |
| $ZrO_2$ | 2.1788 |
| $HfO_2$ | 2.1842 |
| $TeO_2$ | 2.3212 |
| $TiO_2$ | 2.7114 |
| Si | 3.9766 |
| $SiO_2$ doped with $CaF_2$ | ≅1.4 |
| $SiO_2$ doped with B | ≅1.5 |
| $SiO_2$ doped with Ba | ≅1.55 |
| $SiO_2$ doped with P | ≅1.6 |
| $SiO_2$ doped with La | ≅1.9 |
| $SiO_2$ doped with Pb | ≅2 |

Referring to FIG. 7E, a fifth configuration of the light blocking material layer 740L is illustrated, which includes a stack of the light blocking material layer 740L of FIG. 7A, 7B, or 7C and the light blocking material layer 740L of FIG. 7D. Generally, the light blocking material layer 740L of FIG. 7E may include at least one metal layer and a vertically alternating sequence of first material layers 742A having a first refractive index and second material layers 742B having a second refractive index. In one embodiment, the light blocking material layer 740L of FIG. 7E may include at least two metal layers (741A, 741B, 741C, 741D) and a vertically alternating sequence of first material layers 742A having a first refractive index and second material layers 742B having a second refractive index. The at least two metal layers (741A, 741B, 741C, 741D) may overlie, or underlie, the vertically alternating sequence of the first material layers 742A and the second material layers 742B. The at least two metal layers (741A, 741B, 741C, 741D) may be the same as any structure illustrated in FIGS. 7A-7C. The vertically alternating sequence of the first material layers 742A and the second material layers 742B may be the same as in FIG. 7D. The combination of the at least two metal layers (741A, 741B, 741C, 741D) and the vertically alternating sequence of the first material layers 742A and the second material layers 742B reflect light with minimal deviation from 100% reflectivity within the wavelength range from 200 nm to 1,600 nm.

Referring back to FIGS. 6A and 6B, a photoresist layer 747 may be applied over the light blocking material layer 740L, and may be lithographically patterned to form openings within the areas of image pixels without forming an opening within the areas of black level correction (BLC) pixels that include BLC subpixels 809. Each image pixel is a pixel 900 that is used to generate an electronic signal that is proportional to the magnitude of incident light for a pixel of an image, and each BLC pixel is a pixel that is used to generate an electronic signal that measures background noise in the absence of incident light for black level correction of electronic signals generated from the image pixels. An opening may be formed for each subpixel (801, 802, 803) in the image pixels. Specifically, the openings in the photoresist layer 747 may be formed in areas of the second-conductivity-type photodiode layers 602, i.e., within the areas of the photodetectors that include a respective p-n junction between the second-conductivity-type photodiode layers 602 and the doped well structures 607. The areas of the transistors of the sensing circuit (such as the reset transistors 640, the source follower transistors 650, and the select transistors 660) may, or may not, be covered by the photoresist layer 747. The photoresist layer 747 may cover the entire area of the BLC pixels after lithographic patterning.

Figure 8A:
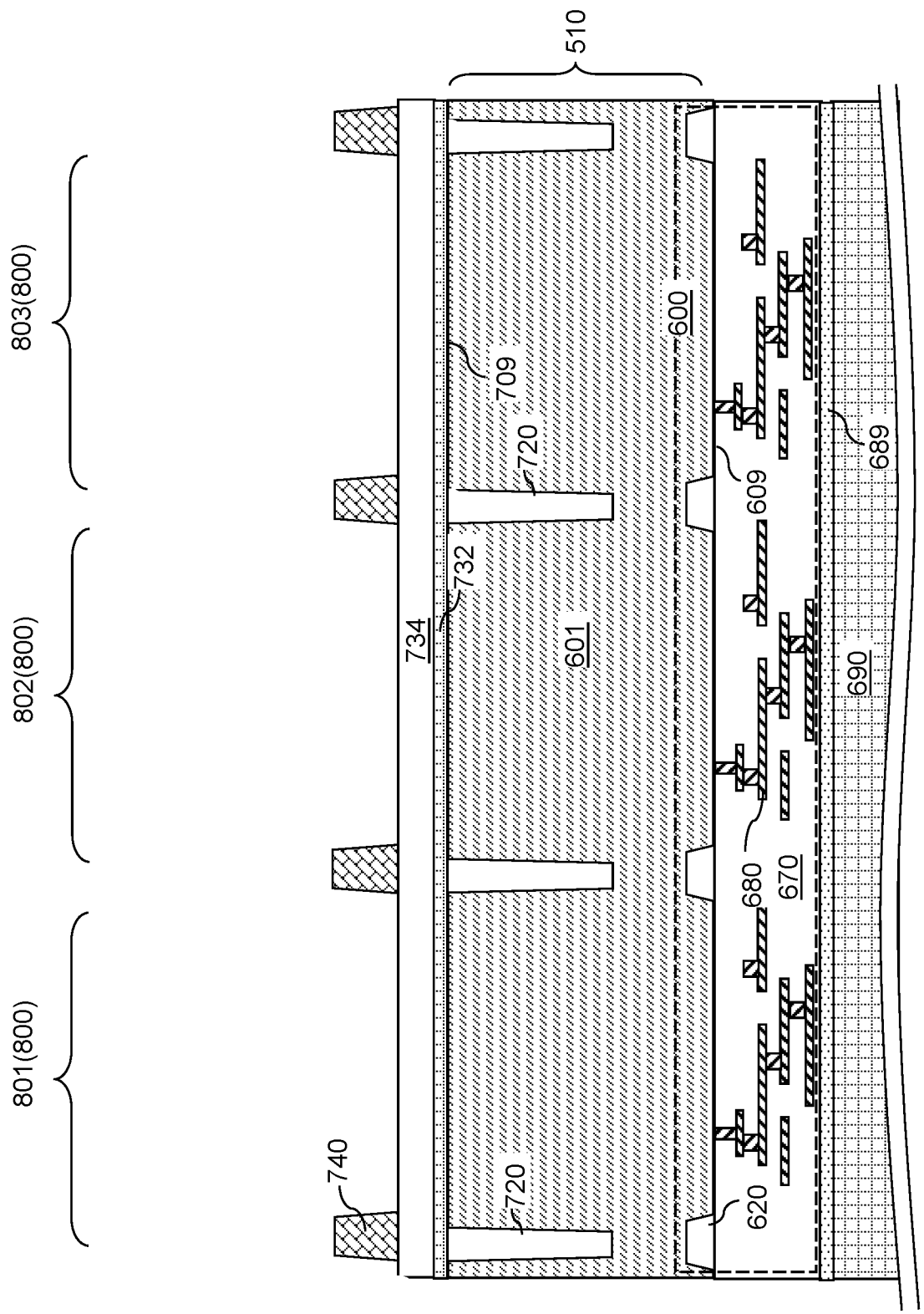
FIG. 8A is a vertical cross-sectional view of the image pixel region of the exemplary structure after formation of a grid structure according to an embodiment of the present disclosure.
Figure 8B:
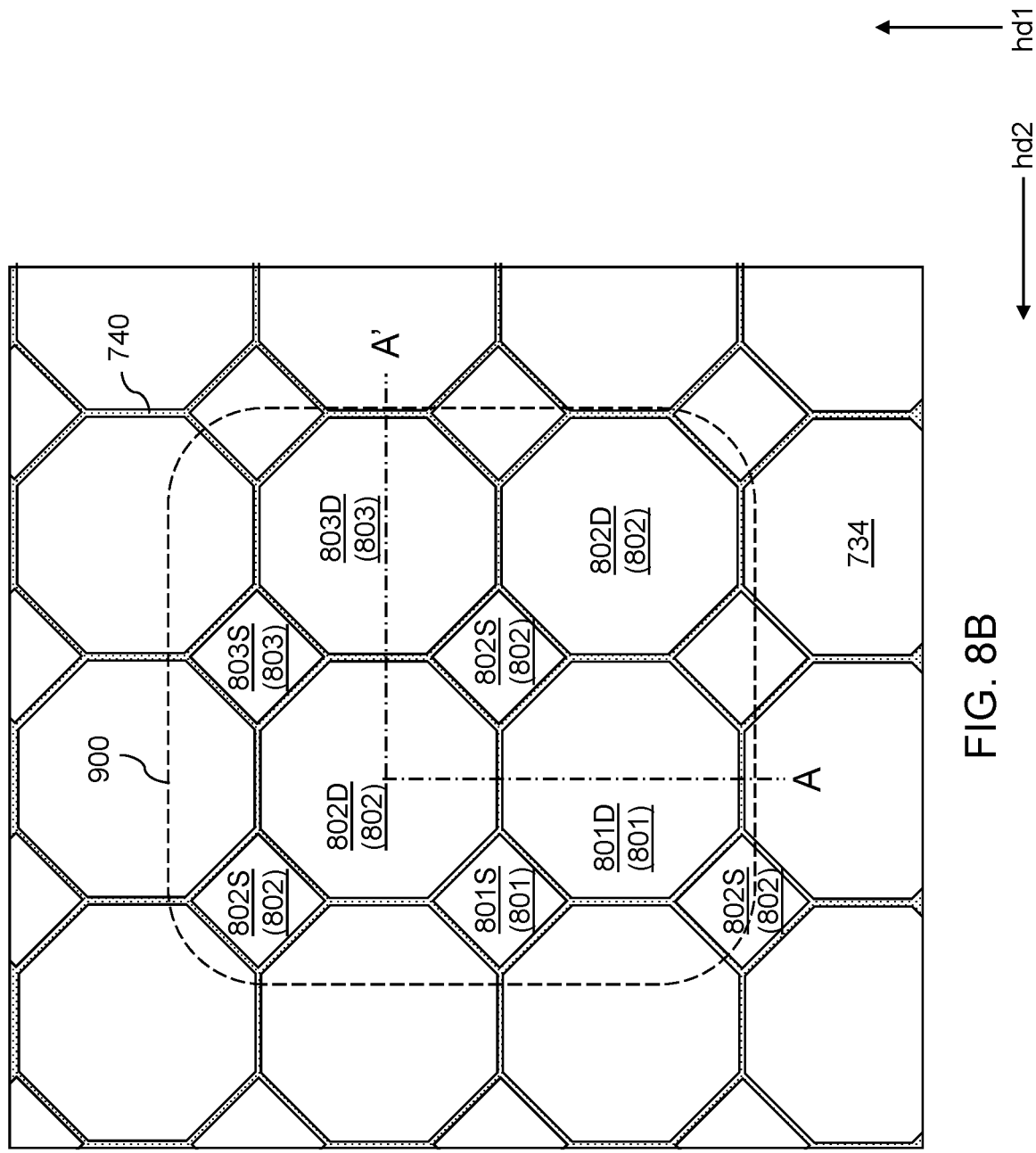
FIG. 8B is a plan view of the image pixel region of the exemplary structure of FIG. 8A. The hinged vertical plane A-A' corresponds to the plane of the vertical cross-sectional view of FIG. 8A.

Referring to FIGS. 8A-8C, portions of the light blocking material layer 740L that are not masked by the patterned portions of the photoresist layer 747 may be etched to form openings therethrough in the image pixel region. For example, an anisotropic etch process such as a reactive ion etch process may be used to transfer the pattern in the photoresist layer 747 through the light blocking material layer 740L. Remaining portions of the light blocking material layer 740L form a grid structure 740. The grid structure 740 may overlie peripheries of the second-conductivity-type photodiode layers 602, and may define a light collection area for each photodetector located within a respective subpixel 800 in the image pixel region. A pixel 900 may include a set of subpixels configured to detect light at different wavelengths.

In one embodiment, each image pixel may include a set of image subpixels. For example, each image pixel may include at least one instance of a first subpixel 801, at least one instance of a second subpixel 802, and at least one instance of a third subpixel 803. In the illustrated example of FIGS. 8A and 8B, an image pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, an image pixel may include various combinations of at least two types of subpixels 800 configured to detect light at different wavelength ranges. Alternatively, an image sensor may be a monochromatic image sensor including a single type of subpixels 800. In this embodiment, each image pixel may include only a single subpixel 800.

Each BLC pixel may be a replica of an image pixel. In one embodiment, each BLC pixel may include a set of image subpixels. For example, each image pixel may include at least one instance of a first BLC subpixel 811, at least one instance of a second BLC subpixel 812, and at least one instance of a third BLC subpixel 813. Generally, a BLC pixel may include various combinations of at least two types of BLC subpixels configured to provide background level electrical signal in the absence of incident light. Alternatively, an image sensor may be a monochromatic image sensor including a single type of subpixels 800. In this embodiment, each BLC pixel may include only a single BLC subpixel.

The grid structure 740 may be formed over the distal surface of the proximal dielectric layer 734 in the image pixel region. The grid structure 740 includes openings that overlie a respective one of the photodetectors comprising a transfer transistor 630. The portions of the distal surface of the proximal dielectric layer 734 that are contacted by the bottom surfaces of the grid structure are planar distal surface portions of the distal surface of the proximal dielectric layer 734.

In some embodiments, the grid structure 740 may divide each subpixel 800 in the image pixel region into a detector region and a sensing circuit region. For example, a first subpixel 801 may include a first detector region 801D that overlies the second-conductivity-type photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Generally, a first unpatterned portion of the light blocking material layer 740L as provided at the processing steps of FIGS. 6A and 6B continuously extends over the entire area of the BLC pixel region, i.e., over each BLC pixels, at the processing steps of FIGS. 8A-8C. The grid structure 740 comprises a second portion of the light blocking material layer 740L as provided at the processing steps of FIGS. 6A and 6B that is provided in the image pixel region and is patterned in the processing steps of FIGS. 8A-8C. As discussed above, the light blocking material layer 740L may be a composite layer stack including multiple layers, and the grid structure 740 comprises a second portion of the layer stack that is laterally adjoined to the first portion of the layer stack. Therefore, the first portion of the layer stack (i.e., the light blocking material layer 740L in the BLC pixel region at the processing steps of FIGS. 8A-8C) and the second portion of the layer stack (i.e., the grid structure 740) have an identical vertical sequence of component layers. Each component layer within the layer stack has a uniform thickness across the first portion of the layer stack and the second portion of the layer stack.

Figure 9A:
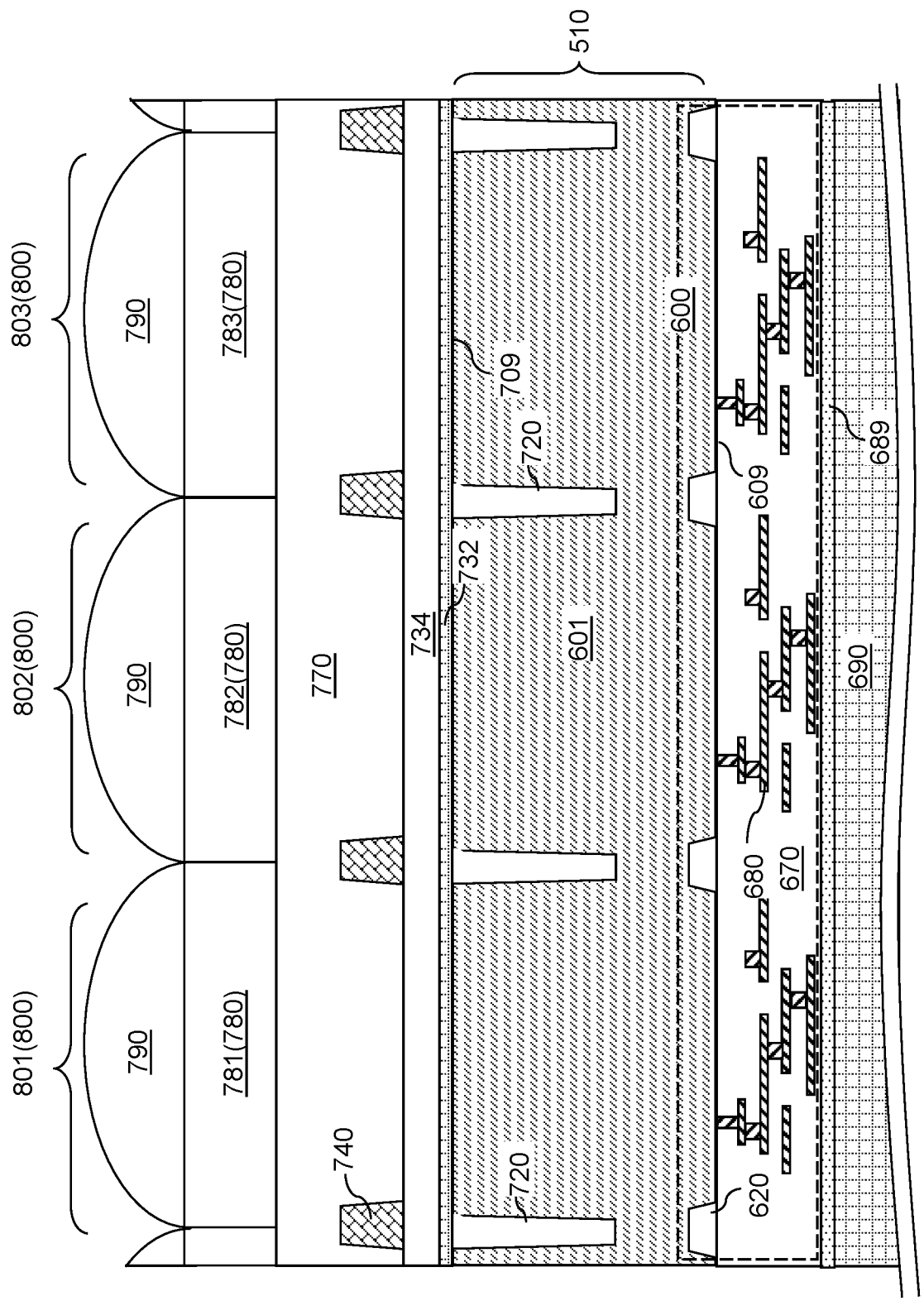
FIG. 9A is a vertical cross-sectional view of the image pixel region of the exemplary structure after formation of an optically transparent layer, color filters, and lenses according to an embodiment of the present disclosure.
Figure 9B:
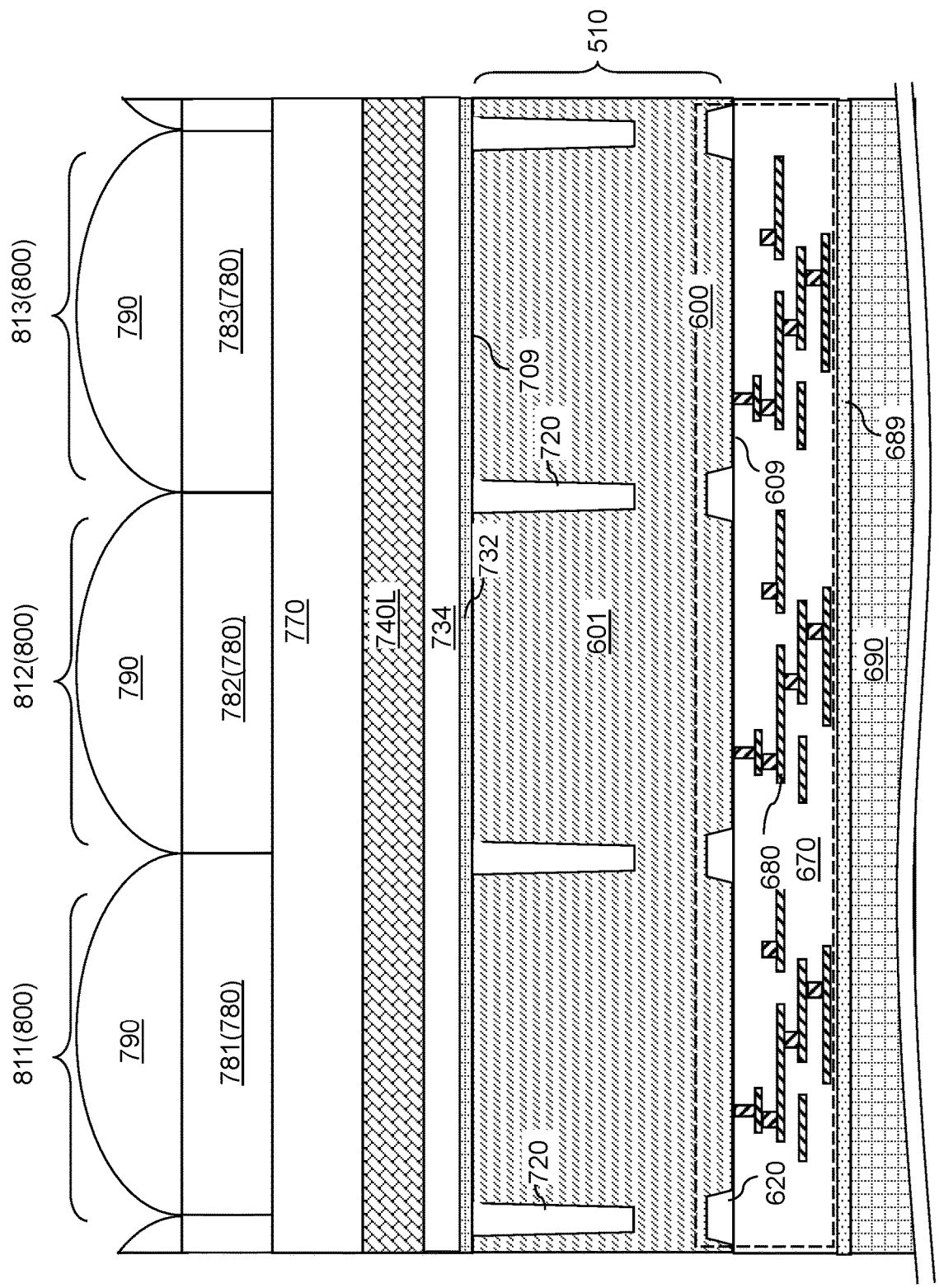
FIG. 9B is a vertical cross-sectional view of the BLC pixel region of the exemplary structure at the processing step of FIG. 9A according to an embodiment of the present disclosure.

Referring to FIGS. 9A and 9B, an optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

The optically transparent layer 770 vertically extends through the openings in the grid structure 740, and has a second refractive index that is different from the first refractive index. The optically transparent layer 770 is formed on the proximal dielectric layer 734.

Various color filtering materials may be applied over the optically transparent layer 770, and may be patterned to form various color filters 780. The color filters 780 may include first-type color filters 781 formed within the regions of the first subpixels 801 and the first BLC subpixels 811, second-type color filters 782 formed within the regions of the second subpixels 802 and the second BLC subpixels 812, and third-type color filters 783 formed within the regions of the third subpixels 803 and the third BLC subpixels 813. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Each combination of portions of the optional ARC layer 732, the proximal dielectric layer 734, the grid structure 740, and the optically transparent layer 770 located within a subpixel 800 in an image pixel region, an overlying color filter 780, and an overlying optical lens 790 constitutes an image subpixel optics assembly that is configured to filter and focus light onto a respective underlying photodetector of an image subpixel. A set of image subpixel optics assembly for all image subpixels within an image pixel constitutes an image pixel optics assembly. Each combination of portions of the optional ARC layer 732, the proximal dielectric layer 734, the light blocking material layer 740L, and the optically transparent layer 770 located within a subpixel 800 in a BLC pixel region, an overlying color filter 780, and an overlying optical lens 790 constitutes a BLC subpixel optics assembly that is configured to block light that that impinges toward a respective underlying photodetector of the BLC subpixel. A set of BLC subpixel optics assembly for all BLC subpixels within an image pixel constitutes an image pixel optics assembly.

Figure 10A:
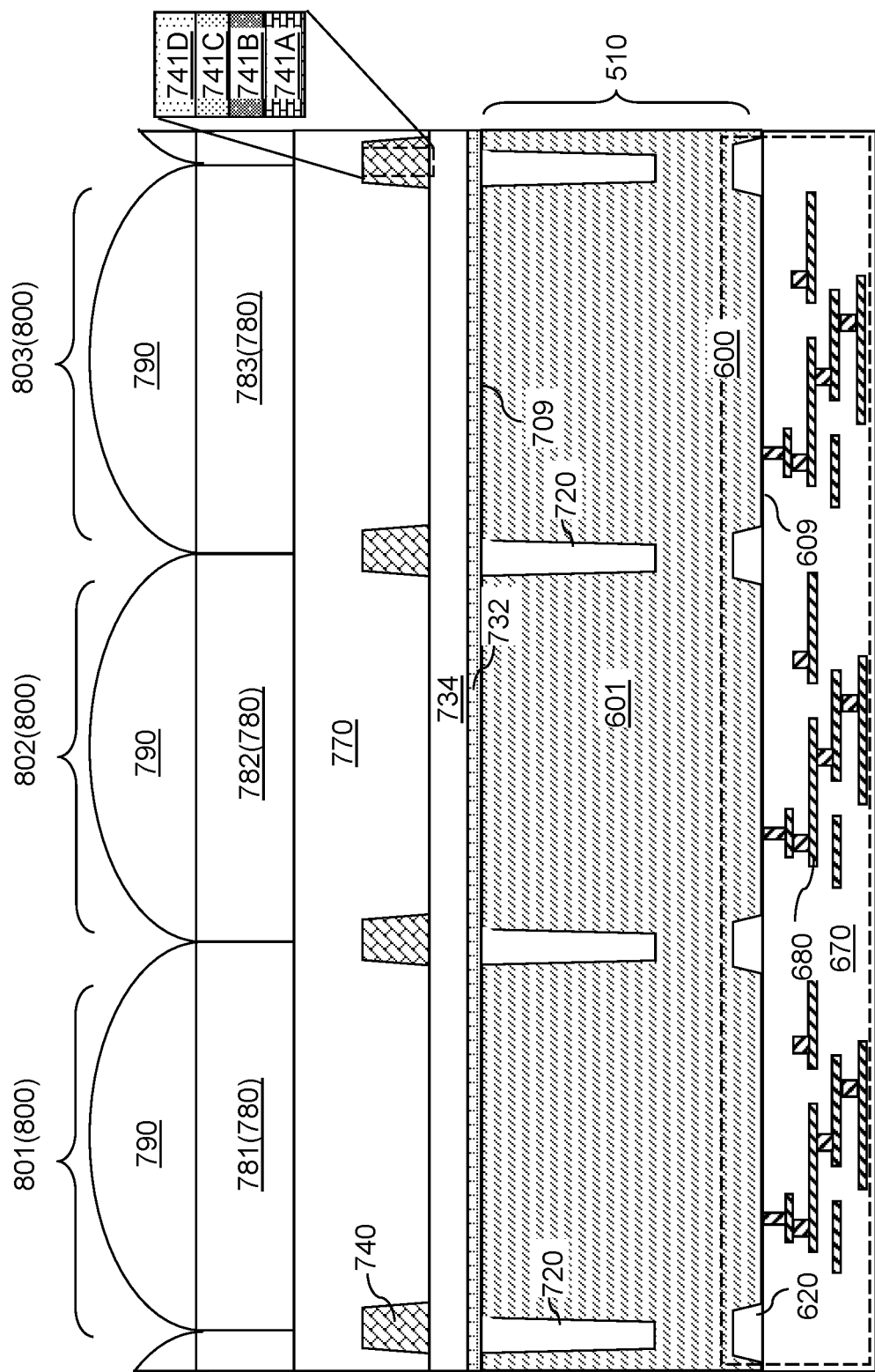
FIG. 10A is a vertical cross-sectional view of the image pixel region of a first configuration of the exemplary structure after removal of the carrier substrate according to an embodiment of the present disclosure.
Figure 10B:
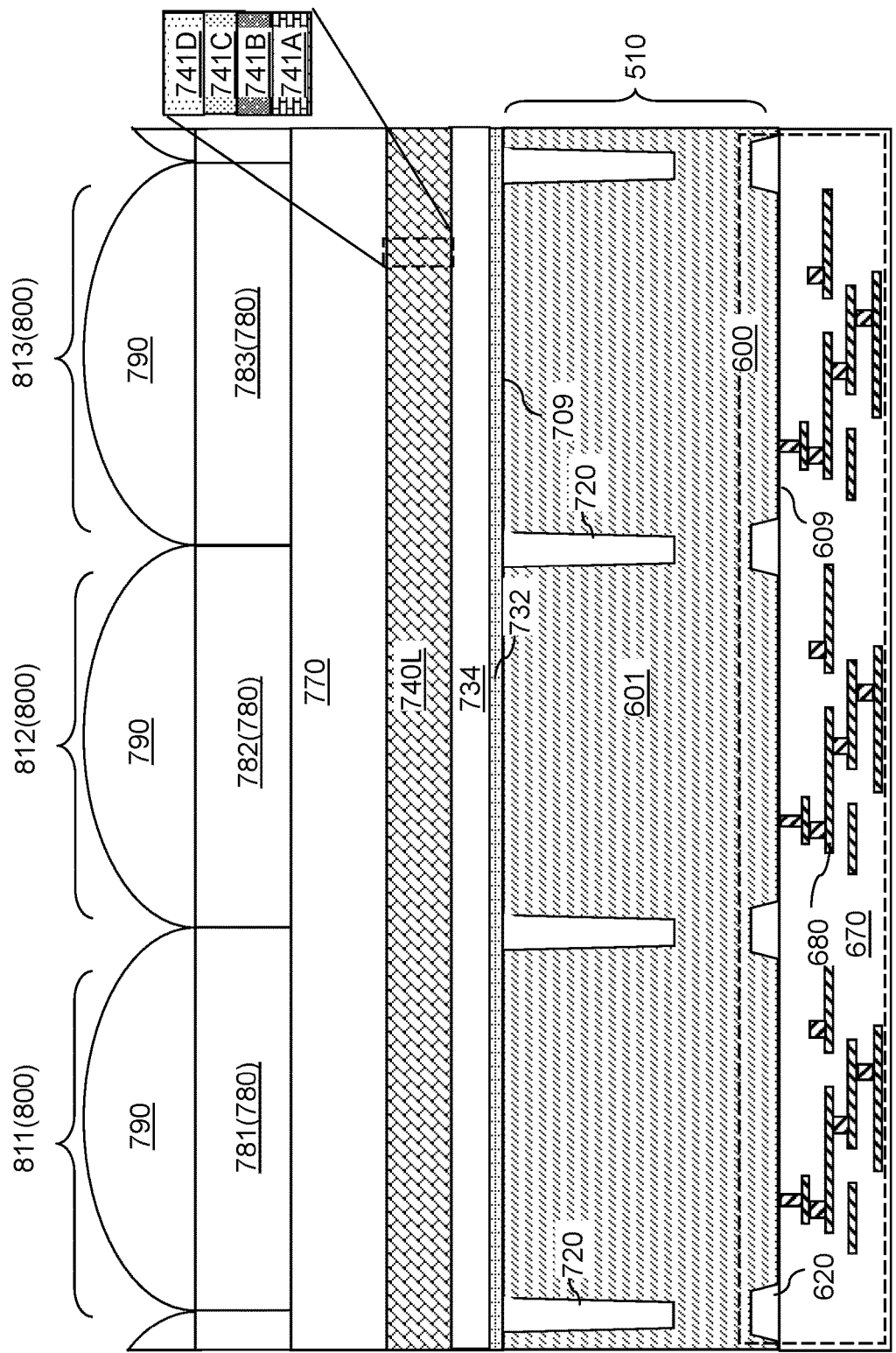
FIG. 10B is a vertical cross-sectional view of the BLC pixel region of first configuration of the exemplary structure at the processing step of FIG. 10A according to an embodiment of the present disclosure.

Referring to FIGS. 10A and 10B, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, an array 1000 of pixels may be formed on the semiconductor substrate 510. Each pixel within the array 1000 of pixels comprises at least one subpixel, and each subpixel comprise a respective photodetector (comprising a transfer transistor 630) and a respective sensing circuit (640, 650, 660) located on a front surface 609 of the semiconductor substrate 510. BLC pixels including BLC subpixels may be provided around an array of image pixels. An image subpixel optics assembly overlies a photodetector circuit of each image subpixel. An image pixel optics assembly overlies photodetector circuits of each image pixel. A BLC subpixel optics assembly overlies a photodetector circuit of each BLC subpixel. A BLC pixel optics assembly overlies photodetector circuits of each BLC pixel.

FIGS. 10A and 10B illustrate a first configuration of the exemplary structure in which the light blocking material layer 740L as provided at the processing steps of FIGS. 6A and 6B includes at least two metal layers (741A, 741B, 741C, 741D) as illustrated in FIGS. 7A-7C and 7E. Each of the BLC pixel optics assembly as provided at the processing steps of FIGS. 10A and 10B comprises a first portion of a layer stack including at least two metal layers (741A, 741B, 741C, 741D) that continuously extend over the entire area of the respective BLC pixel. Each of the image pixel optics assemblies as provided at the processing steps of FIGS. 10A and 10B comprises a portion of a grid structure 740, which is a second portion of the layer stack including at least two metal layers (741A, 741B, 741C, 741D) that includes discrete openings over areas of the photodetectors.

Each of the at least two metal layers (741A, 741B, 741C, 741D) comprises a respective wavelength sub-range having a greater reflectivity than another metal layer selected from the at least two metal layers within a wavelength range from 200 nm to 1,600 nm, and wherein the first portion of the layer stack does not include any opening therethrough. In some embodiments, one of the at least two metal layers (741A, 741B, 741C, 741D) comprises a refractory metal layer, and another of the at least two metal layers (741A, 741B, 741C, 741D) comprises a layer selected from a gold layer, a silver layer, a copper layer, and an aluminum layer. Alternatively or additionally, the at least two metal layers (741A, 741B, 741C, 741D) may comprise at least two layers selected from a gold layer, a silver layer, a copper layer, and an aluminum layer. In one embodiment, the light blocking material layer 740L and the grid structure 740 may further include a vertically alternating sequence of first material layers 742A having a first refractive index and second material layers 742B having a second refractive index as illustrated in FIG. 7E.

Figure 11A:
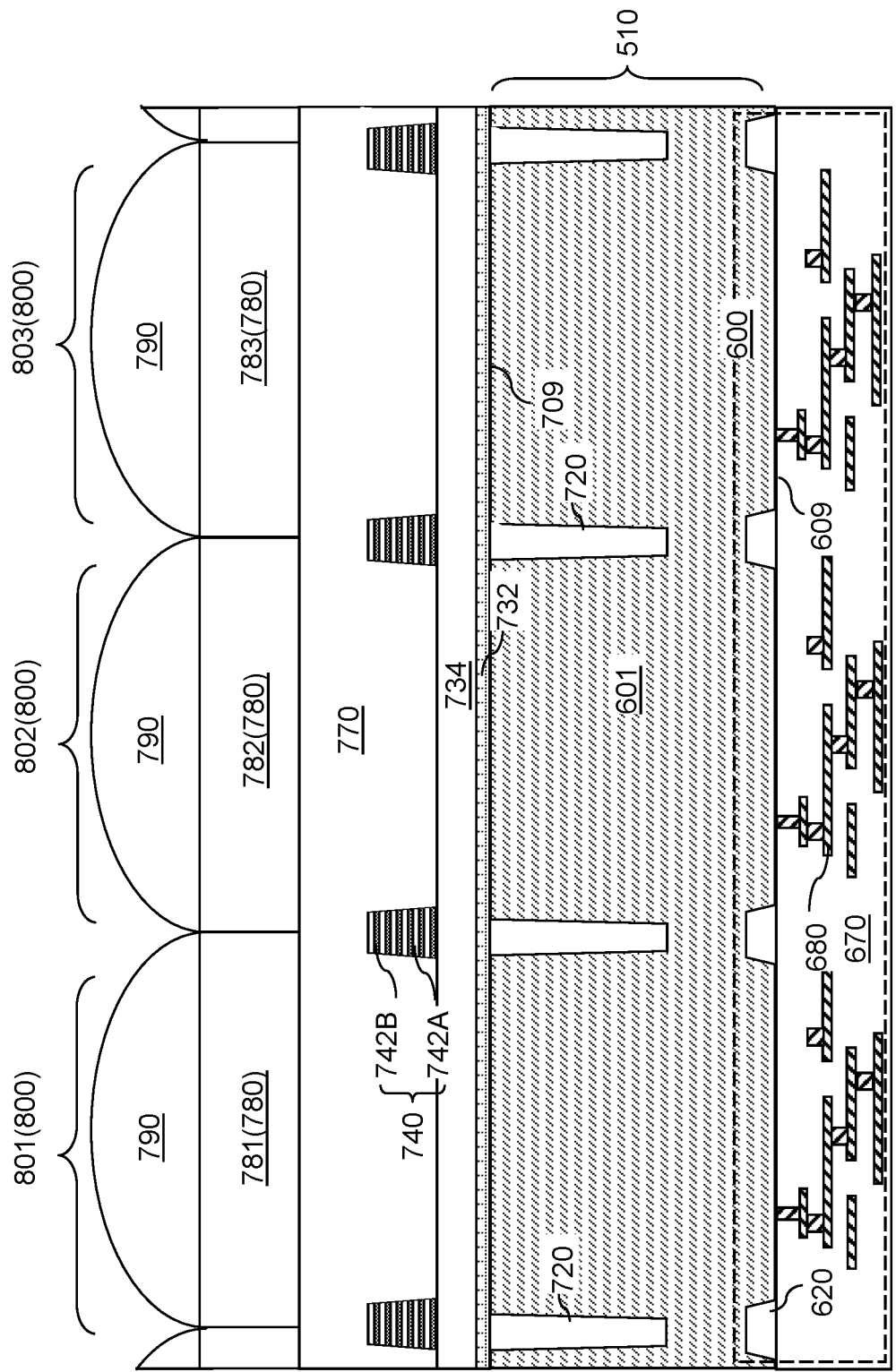
FIG. 11A is a vertical cross-sectional view of the image pixel region of a second configuration of the exemplary structure after removal of the carrier substrate according to an embodiment of the present disclosure.
Figure 11B:
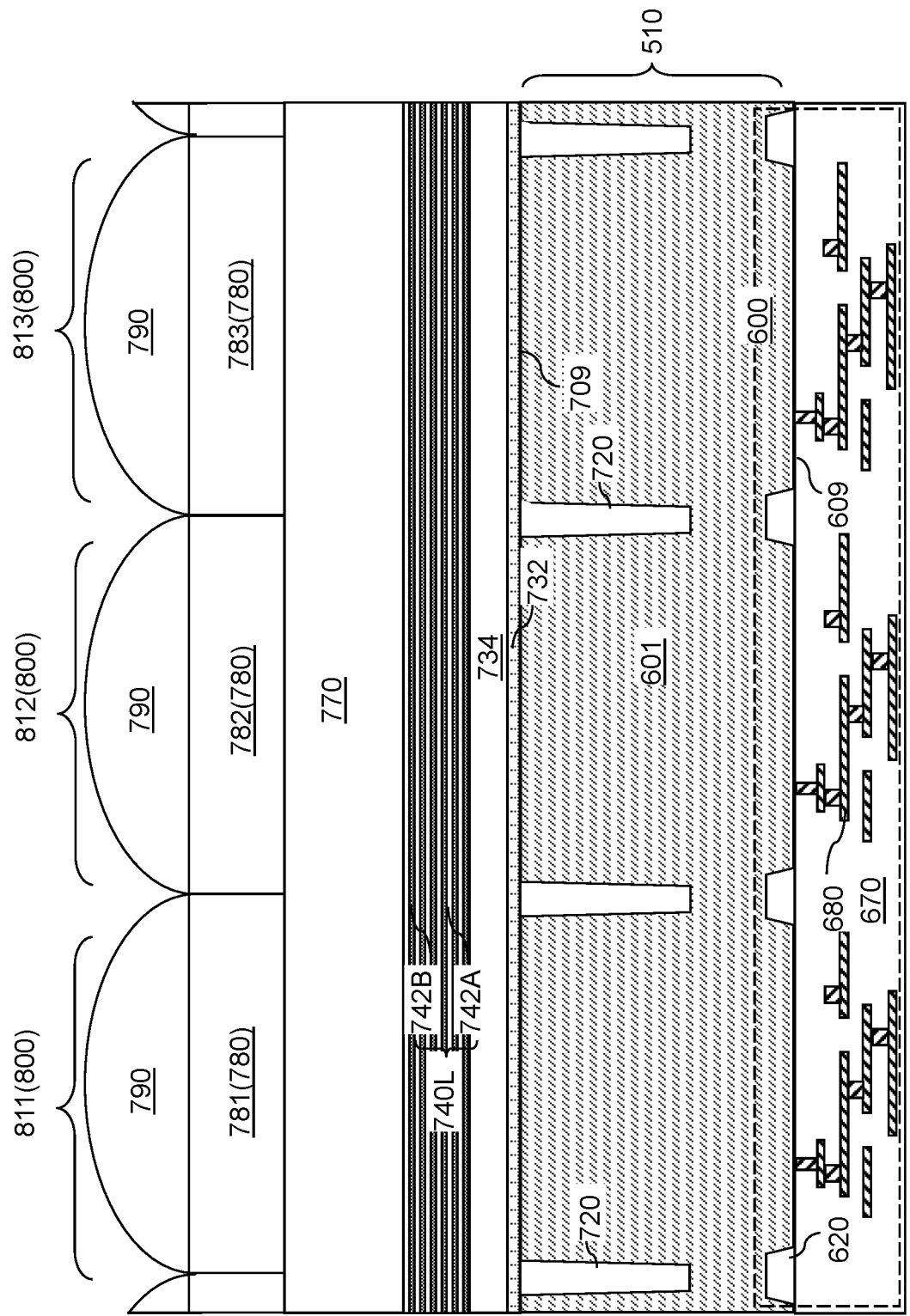
FIG. 11B is a vertical cross-sectional view of the BLC pixel region of the second configuration of the exemplary structure after removal of the carrier substrate according to an embodiment of the present disclosure.

Referring to FIGS. 11A and 11B, a second configuration of the exemplary structure is illustrated, in which the light blocking material layer 740L as provided at the processing steps of FIGS. 6A and 6B includes a layer stack including a vertically alternating sequence of first material layers 742A having a first refractive index and second material layers 742B having a second refractive index as illustrated in FIGS. 7D and 7E. In this case, each of the BLC pixel optics assemblies comprises a first portion of a layer stack including a vertically alternating sequence of first material layers 742A having a first refractive index and second material layers 742B having a second refractive index. The first portion of the layer stack does not include any opening therethrough. Each of the image pixel optics assemblies comprises a portion of a grid structure 740, which is a second portion of the layer stack of the vertically alternating sequence of the first material layers 742A and the second material layers 742B that includes discrete openings over areas of the photodetectors. The first portion of the layer stack and the second portion of the layer stack have an identical vertical sequence of component layers. Each component layer within the layer stack has a uniform thickness across the first portion of the layer stack and the second portion of the layer stack.

In one embodiment, the first material layers 742A and/or the second material layers 742B comprise a dielectric metal oxide. In one embodiment, each dielectric metal oxide in the first material layers 742A and/or the second material layers 742B comprises, and/or consists essentially of, a material selected from magnesium oxide, aluminum oxide, ytterbium oxide, zinc oxide, tantalum oxide, zirconium oxide, hafnium oxide, tellurium oxide, and titanium oxide.

In one embodiment, the first material layers or the second material layers comprise a doped silicate glass including at least one dopant element at an atomic percentage in a range from 1% to 50%. In one embodiment, the at least one dopant element may comprise at least one of combination of calcium and fluorine, boron, barium, phosphorus, lanthanum, and lead. In one embodiment, the first material layers 742A and/or the second material layers 742B may consist essentially of silicon, doped silicon including dopants at an atomic concentration less than 50% (such as from 0.5% to 50%), silicon nitride, silicon oxide, and silicon-rich silicon oxide.

In one embodiment, the first material layers 742A have a first refractive index, the second material layers 742B have a second refractive index that is different from the first refractive index, the first refractive index and the second refractive index are in a range from 1.0 to 4.0, and the difference between the first refractive index and the second refractive index is in a range from 0.1 to 3.0. In one embodiment, each of the first material layers 742A has a first thickness, each of the second material layers 742B has a second thickness, and the first thickness and the second thickness are in a range from 0.5 nm to 500 nm, such as from 5 nm to 50 nm.

Figure 12A:
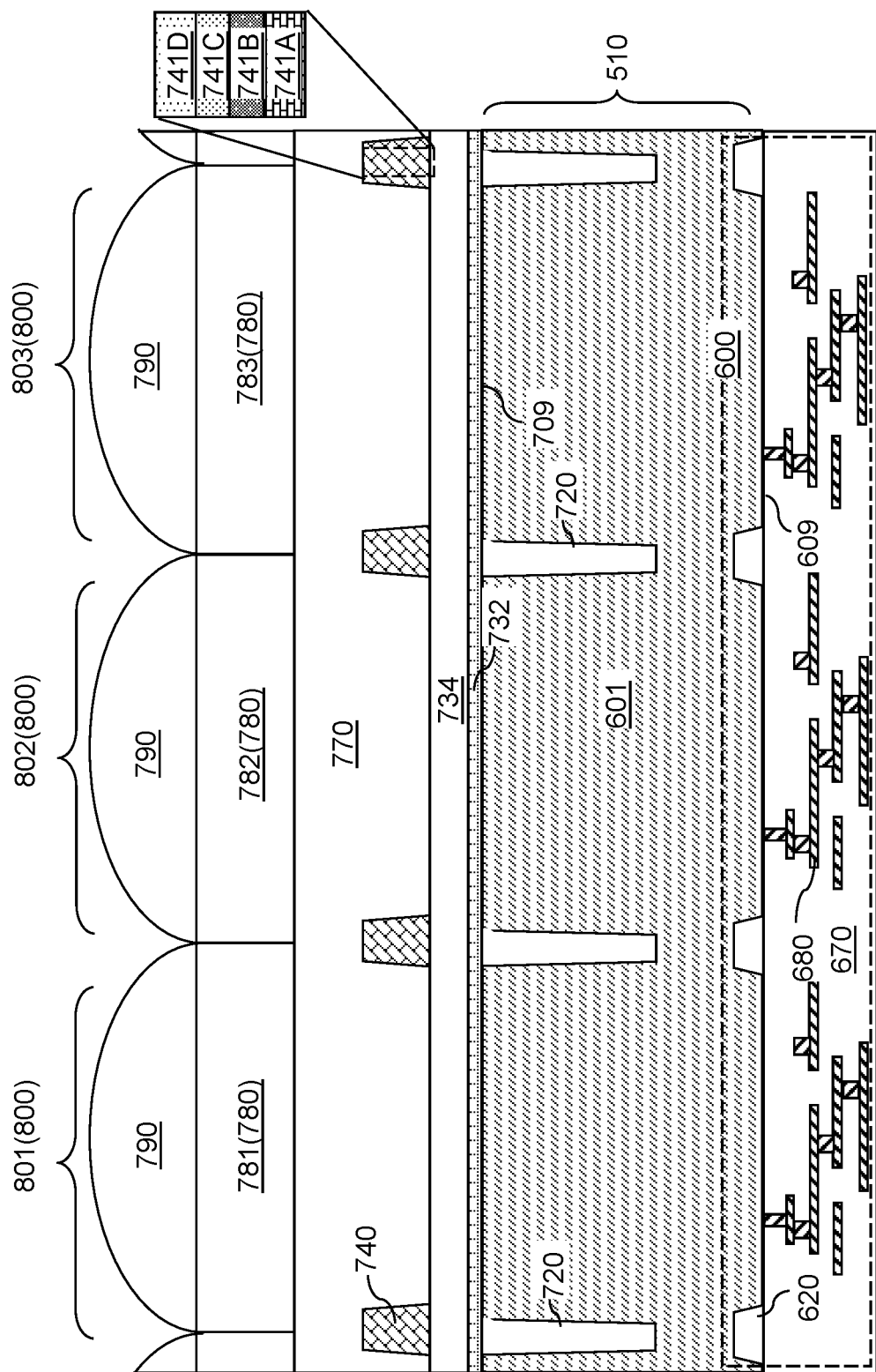
FIG. 12A is a vertical cross-sectional view of the image pixel region of a third configuration of the exemplary structure after removal of the carrier substrate according to an embodiment of the present disclosure.
Figure 12B:
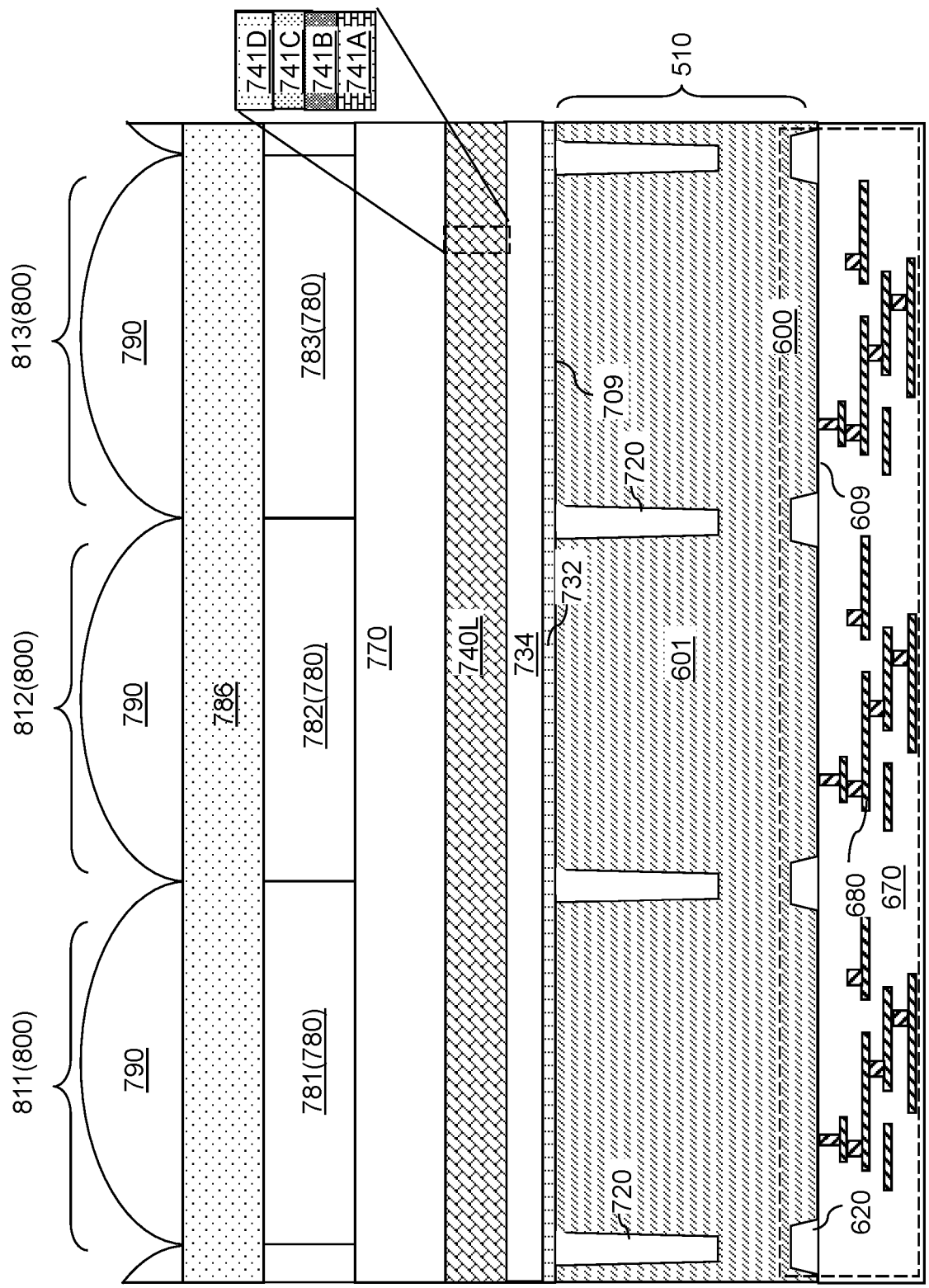
FIG. 12B is a vertical cross-sectional view of the BLC pixel region of the third configuration of the exemplary structure after removal of the carrier substrate according to an embodiment of the present disclosure.

Referring to FIGS. 12A and 12B, a third configuration of the exemplary structure according to an embodiment of the present disclosure illustrated. The third configuration of the exemplary structure may be derived from any configuration of the exemplary structure described above by forming an infrared blocking material layer 786 only in the BLC pixel region. An infrared blocking material may be deposited over, or below, the layer of the color filters 780, or may be formed over the optical lenses 790. The infrared blocking material layer 786 may be patterned so that the entire area of the BLC pixel region is covered by the infrared blocking material, and the area of the image pixel region is not covered by the infrared blocking material. Thus, the infrared blocking material layer 786 is not present in the image pixel region, and covers the entire area of the BLC pixel region.

The infrared blocking material layer 786 includes a material that absorbs infrared radiation in a wavelength range from 800 nm to 1,600 nm. In one embodiment, the infrared blocking material layer 786 may include a polymer material, a semiconductor material, and/or a metallic material. For example, the infrared blocking material layer 786 may include a color resist embedding metal particles and/or a color resist mixed with, or embedding, black resin. The metal particles can include particles of one or more refractory metals such as tungsten, niobium, molybdenum, tantalum, rhenium, titanium, vanadium, chromium, zirconium, hafnium, ruthenium, rhodium, osmium, and iridium. The average size (e.g., the effective diameter of a sphere providing a same volume) of the metal particles can be in a range from 1 nm to 100 nm, such as from 5 nm to 30 nm, although lesser and greater average sizes can also be employed. The thickness of the infrared blocking material layer 786 may be in a range from 100 nm to 1,000 nm, although lesser and greater thicknesses may also be used.

In one embodiment, each of the BLC pixel optics assemblies comprises an infrared blocking material layer 786 that provides a higher absorption coefficient within a wavelength range from 800 nm to 1,600 nm than any color filter material of the color filters 780 within the image pixel optics assemblies. While the present disclosure is described using an embodiment in which the light blocking material layer 740L in the third exemplary structure uses the third configuration of the light blocking material layer 740L illustrated in FIG. 7C, the light blocking material layer 740L in the third configuration of the exemplary structure may have any configuration illustrated in FIGS. 7A-7E.

Figure 13A:
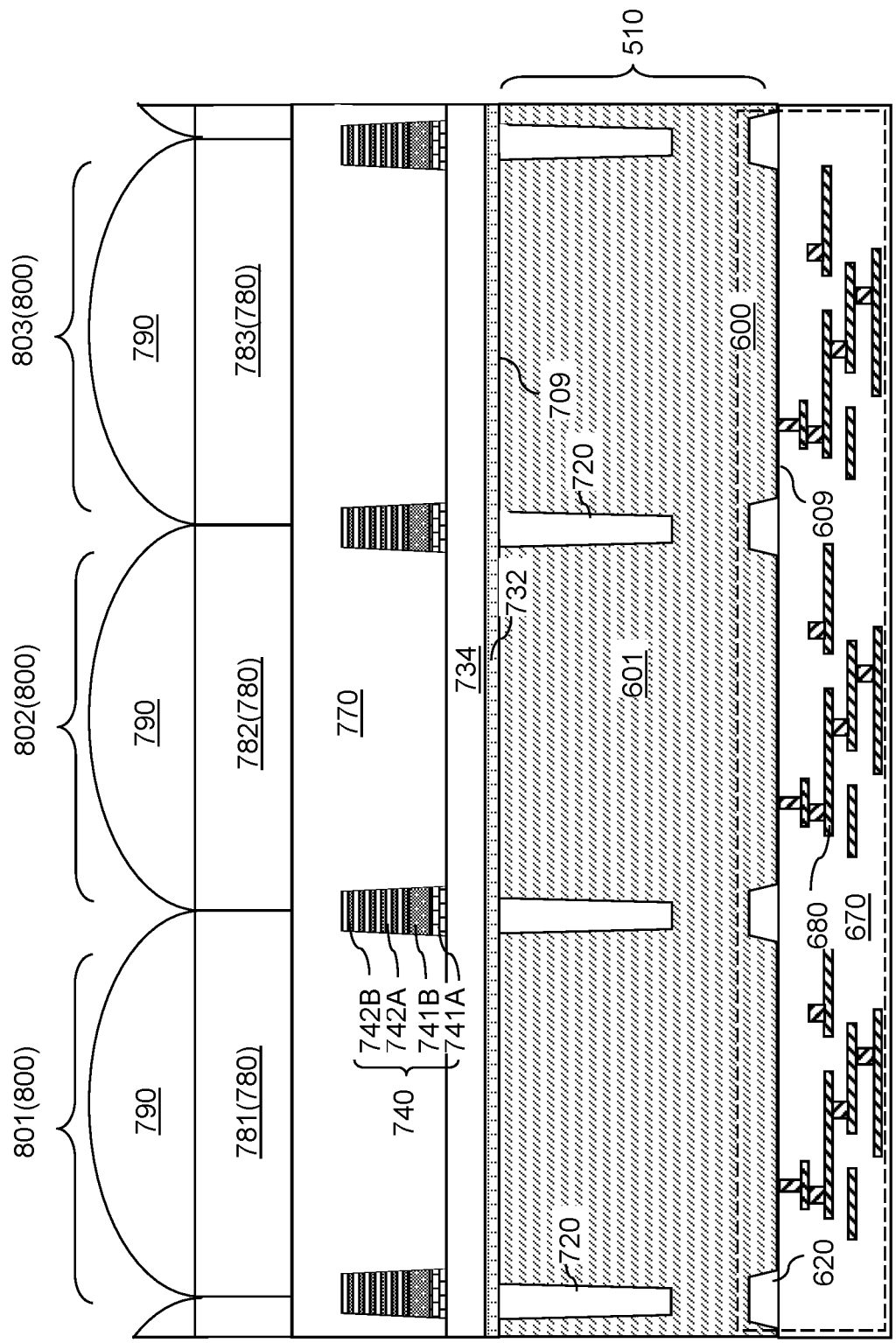
FIG. 13A is a vertical cross-sectional view of the image pixel region of a fourth configuration of the exemplary structure after removal of the carrier substrate according to an embodiment of the present disclosure.
Figure 13B:
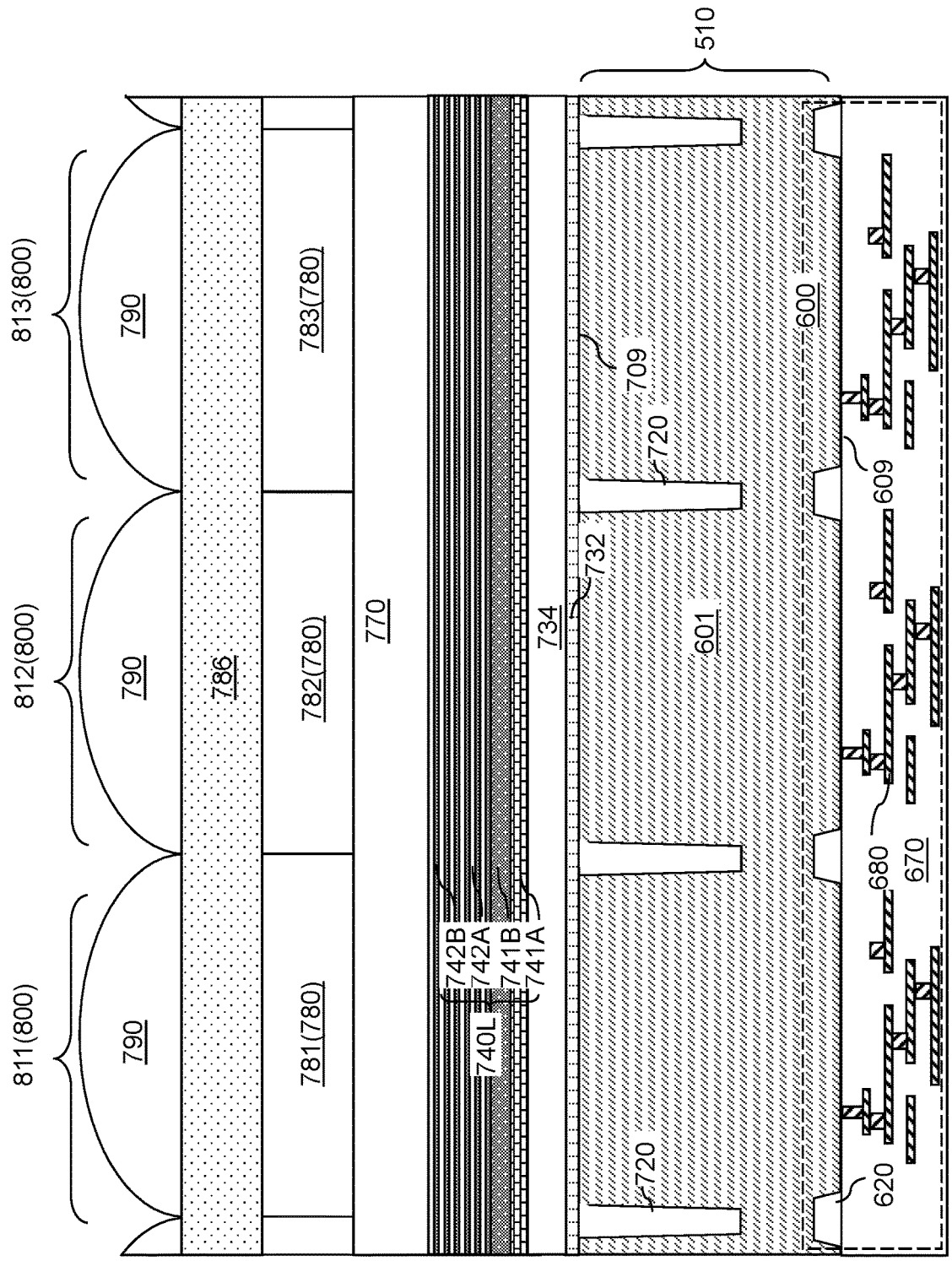
FIG. 13B is a vertical cross-sectional view of the BLC pixel region of the fourth configuration of the exemplary structure after removal of the carrier substrate according to an embodiment of the present disclosure.

Referring to FIGS. 13A and 13B, a fourth configuration of the exemplary structure according to an embodiment of the present disclosure is illustrated. The fourth configuration of the exemplary structure includes the fifth configuration of the light blocking material layer 740L illustrated in FIG. 7E. In this case, the layer stack of the light blocking material layer 740L may include at least one metal layer in contact with the vertically alternating sequence of first material layers 742A and second material layers 742B. The at least one metal layer may include at least two metal layers (741A, 741B, 741C, 741D) described above.

Figure 14:
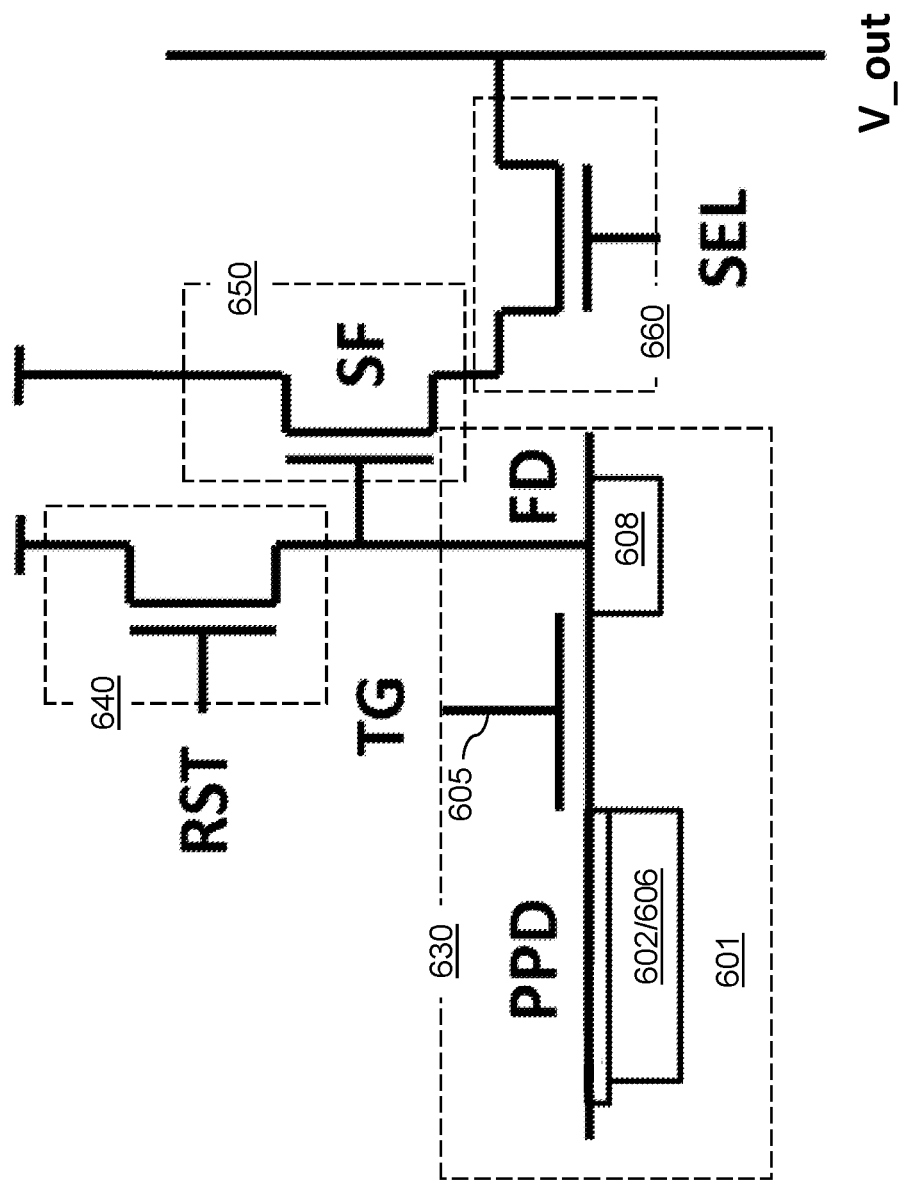
FIG. 14 is a schematic circuit diagram of a photodetector circuit according to an embodiment of the present disclosure.

Referring to FIG. 14, a circuit schematic for a photodetector circuit is illustrated according to an embodiment of the present disclosure. The configuration of the photodetector circuit includes a transfer transistor 630 and an interconnected assembly of field effect transistors (640, 650, 660). The transfer transistor 630 may include a p-n junction between the combination of a second-conductivity-type photodiode layer 602 and a buried second-conductivity-type photodiode layer 606 and the substrate semiconductor layer 601 having a doping of the first conductivity type. The set of the substrate semiconductor layer 601, the buried second-conductivity-type photodiode layer 606, the second-conductivity-type photodiode layer 602, and the first-conductivity-type pinning layer 603 functions as a photodiode PD. The second-conductivity-type photodiode layer 602 functions as a source region of the transfer transistor 630.

A floating diffusion region 608 (labeled as "FD") functions as a drain region of the transfer transistor 630. A transfer gate electrode 605 (labeled "TG") controls the transfer of the electrical charges accumulated in the second-conductivity-type photodiode layer 602 into the floating diffusion region 608 through a semiconductor channel that underlies the transfer gate electrode 605. The transfer transistor 630 may function as a photodetector.

The sensing circuit includes the interconnected assembly of field effect transistors (640, 650, 660). The interconnected assembly of the field effect transistors (640, 650, 660) is connected to the floating diffusion region 608. The interconnected assembly of the field effect transistors (640, 650, 660) includes a reset transistor RST, a source follower transistor SF, and a select transistor SEL. The reset transistor 640 (i.e., RST) is configured to drain the electrical charges in the floating diffusion region 608 immediately before sensing so that the electrical charge that accumulates in the floating diffusion region 608 during sensing is linearly proportional to the electrical charge accumulated in the second-conductivity-type photodiode layer 602. The gate electrode of the source follower transistor 650 (i.e., SF) is electrically connected to the floating diffusion region 608 via a set of metal interconnect structures. Thus, the voltage at the gate electrode of the source follower transistor 650 is proportional to the electrical charges in the floating diffusion region 608. The select transistor 660 (i.e., SEL) may be turned on during a read operation to output the voltage at a common node of the source follower transistor and the select transistor 660 (as modulated by the voltage at the gate electrode of the source follower transistor 650) to a column output bus (labeled "V_out").

Referring to FIGS. 1A-14 collectively and according to various embodiments of the present disclosure, an image sensor is provided, which comprises an array of image pixels (such as $P_{ij}$ ($2 \leq i \leq (M-1)$, $2 \leq j \leq (N-1)$ in FIGS. 1A and 1B) located on a semiconductor substrate 510, wherein each image pixel within the array of image pixels comprises an image pixel photodetector (which comprises each photodetector, such as each transfer transistor 630, within the image pixel), an image pixel sensing circuit (which comprises each sensing circuit within the image pixel), and an image pixel optics assembly configured to filter and direct incident light onto the image pixel photodetector. The image sensor comprises black level correction (BLC) pixels (such as $P_{st}$ in which s is 1 or M, or t is 1 or N in FIGS. 1A and 1B) located adjacent to the array of image pixels on the semiconductor substrate 510, wherein each BLC pixel comprises a BLC pixel photodetector (which comprises each photodetector, such as each transfer transistor 630, within the BLC pixel), a BLC pixel sensing circuit (which comprises each sensing circuit within the BLC pixel), and a BLC pixel optics assembly configured to block light that impinges onto the BLC pixel photodetector.

In some embodiments, each of the BLC pixel optics assemblies comprises a first portion of a layer stack including a vertically alternating sequence of first material layers 742A having a first refractive index and second material layers 742B having a second refractive index. The first portion of the layer stack does not include any opening therethrough.

In some embodiments, each of the BLC pixel optics assembly comprises a first portion of a layer stack including at least two metal layers (741A, 741B, 741C, 741D). Each of the at least two metal layers (741A, 741B, 741C, 741D) comprises a respective wavelength sub-range having a greater reflectivity than another metal layer (741A, 741B, 741C, 741D) selected from the at least two metal layers within a wavelength range from 200 nm to 1,600 nm. The first portion of the layer stack does not include any opening therethrough. In one embodiment, each of the at least two metal layers (741A, 741B, 741C, 741D) comprises a respective wavelength sub-range having a greater reflectivity than any other metal layer (741A, 741B, 741C, 741D) selected from the at least two metal layers within a wavelength range from 200 nm to 1,600 nm.

In some embodiments, each of the BLC pixel optics assembly comprises an infrared blocking material layer 786 that provides a higher absorption coefficient within a wavelength range from 800 nm to 1,600 nm than any color filter material within the image pixel optics assemblies.

Generally, the image pixel optics assemblies comprise a grid structure 740 including an array of openings therethrough. The grid structure 740 comprises a second portion of the layer stack that is laterally adjoined to the first portion of the layer stack.

Figure 15:
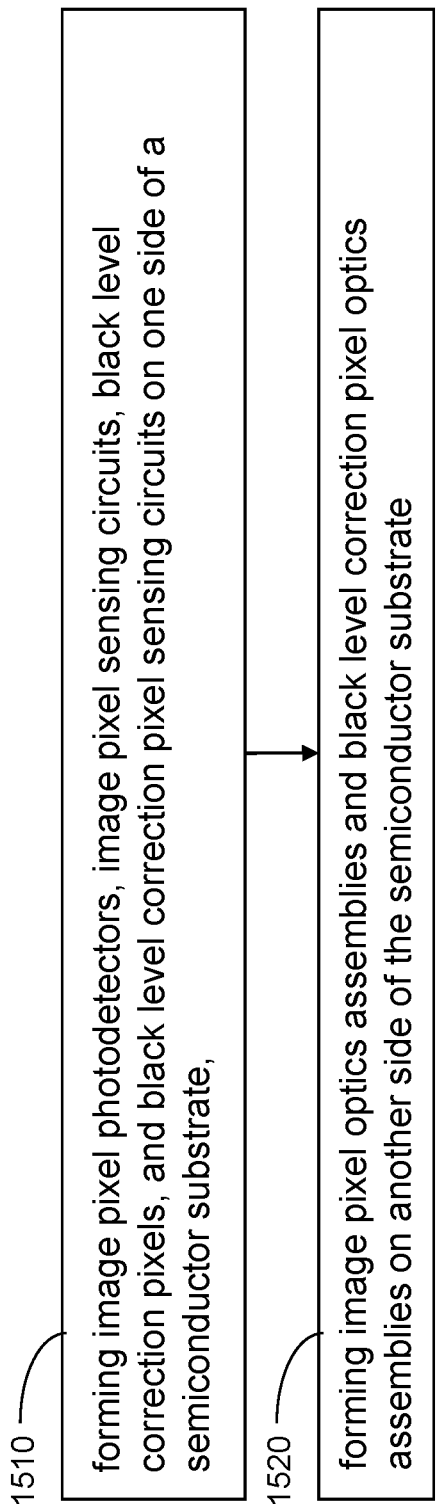
FIG. 15 is a process flow diagram illustrating an exemplary process sequence for forming an image sensor according to an embodiment of the present disclosure.

Referring to FIG. 15, a process flow diagram illustrates an exemplary process sequence for forming an image sensor according to an embodiment of the present disclosure. Referring to step 1510, image pixel photodetectors, image pixel sensing circuits, black level correction pixels, and black level correction pixel sensing circuits may be formed on one side of a semiconductor substrate 510. Referring to step 1520, image pixel optics assemblies and black level correction pixel optics assemblies may be formed on another side of the semiconductor substrate 510. The image pixel optics assemblies and black level correction pixel optics assemblies may have the structural characteristics described above.

The various embodiments of the present disclosure provide an image sensor including black level correction (BLC) pixels that contain a respective BLC pixel optics assembly. A composite material layer including a layer stack of at least two material layers may be formed as a light blocking material layer 740L in each of the BLC pixel optics assemblies to enhance light reflection in the BLC pixels. Alternatively or additionally, an infrared blocking material layer 786 may be formed in the BLC pixels to enhance blocking of infrared radiation for the BLC pixels. Enhanced blocking of light in the BLC pixels increases the accuracy of measurement of background electrical signal for the photodetectors, and may enhance fidelity of the image captures by the image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
an array of image pixels located on a semiconductor substrate;
black level correction (BLC) pixels located adjacent to the array of image pixels on the semiconductor substrate;
a patterned layer stack extending over the array of image pixels and over the BLC pixels, wherein the patterned layer stack comprises N repetitions of a unit layer stack in which N instances of the unit layer stack are repeated along a vertical direction, wherein N is an integer in a range from 2 to 20, and wherein the unit layer stack includes a first material layer having a first refractive index and a second material layer having a second refractive index that is different from the first refractive index, and wherein the patterned layer stack comprises a first portion that overlies the BLC pixels and does not include any opening therethrough, and comprises a second portion having a pattern of a grid structure including an array of openings therein, wherein each opening in the grid structure overlies, and has a respective areal overlap with, a respective each image pixel within the array of image pixels for transmission of light therethrough, wherein the first portion of the patterned layer stack and the grid structure of the patterned layer stack are configured to block light in a wavelength range by generating a constructive interference pattern for the wavelength range such that a reflectivity of light within the wavelength range is in a range from 0.8 to 1.0;
an optically transparent layer having a planar top surface and laterally extending continuously over an entirety of the patterned layer stack and fills each opening within the array of openings; and
an infrared blocking material layer overlying the first portion of the patterned layer stack and does not cover any of the second portion of the patterned layer stack.

2. The image sensor of claim 1, wherein:
an entirety of the patterned layer stack has an identical vertical sequence of component layers; and
each component layer within the patterned layer stack has a uniform thickness across the first portion of the patterned layer stack and the second portion of the patterned layer stack.

3. The image sensor of claim 1, further comprising:
first color filters contacting a respective segment of a top surface of the second portion of the patterned layer stack; and
second color filters contacting a respective surface segment of a top surface of the infrared blocking material layer,
wherein the infrared blocking material layer provides a higher absorption coefficient within a wavelength range from 800 nm to 1,600 nm than any of the second color filters.

4. The image sensor of claim 1, wherein:
the patterned layer stack is located on a first side of the semiconductor substrate; and
each image pixel within the array of image pixels comprises an image pixel photodetector located in a semiconductor substrate and an image pixel sensing circuit located on a second side of the semiconductor substrate that is an opposite side of the first side.

5. The image sensor of claim 4, further comprising deep trench isolation structures located in the semiconductor substrate and having an areal overlap with the grid structure along a vertical direction.

6. The image sensor of claim 4, further comprising a proximal dielectric layer located between the semiconductor substrate and the patterned layer stack and continuously extending over the array of image pixels and the BLC pixels.

7. The image sensor of claim 1, wherein the first material layers or the second material layers comprise a dielectric metal oxide.

8. The image sensor of claim 1, wherein the first material layers or the second material layers comprise a doped silicate glass including at least one dopant element at an atomic percentage in a range from 1% to 50%.

9. The image sensor of claim 1, wherein the first material layers or the second material layers consists essentially of silicon, doped silicon including dopants at an atomic concentration less than 50%, silicon nitride, silicon oxide, and silicon-rich silicon oxide.

10. The image sensor of claim 1, wherein:
the first refractive index and the second refractive index are in a range from 1.0 to 4.0; and
a difference between the first refractive index and the second refractive index is in a range from 0.1 to 3.0.

11. The image sensor of claim 1, wherein the patterned layer stack further comprises at least one metal layer in contact with the vertically alternating sequence of first material layers.

12. The image sensor of claim 1, wherein the patterned layer stack comprises a contiguous structure in which the second portion of the patterned layer stack is laterally adjoined to the first portion of the patterned layer stack.

13. An image sensor comprising:
an array of image pixels located on a semiconductor substrate;
black level correction (BLC) pixels located adjacent to the array of image pixels on the semiconductor substrate;
a patterned layer stack extending over the array of image pixels and over the BLC pixels, wherein the patterned layer stack comprises at least two metal layers, wherein one of the at least two metal layers comprises a respective wavelength sub-range having a greater reflectivity than another metal layer selected from the at least two metal layers within a wavelength range from 200 nm to 1,600 nm, wherein the patterned layer stack further comprises N repetitions of a unit layer stack in which N instances of the unit layer stack are repeated along a vertical direction, wherein N is an integer in a range from 2 to 20, and wherein the unit layer stack includes a first material layer having a first refractive index and a second material layer having a second refractive index that is different from the first refractive index, and wherein the patterned layer stack comprises a first portion that overlies the BLC pixels and does not include any opening therethrough, and comprises a second portion having a pattern of a grid structure including an array of openings therein, wherein each opening in the grid structure overlies, and has a respective areal overlap with, a respective each image pixel within the array of image pixels for transmission of light therethrough, wherein the first portion of the patterned layer stack and the grid structure of the patterned layer stack are configured to block light in a wavelength range by generating a constructive interference pattern for the wavelength range such that a reflectivity of light within the wavelength range is in a range from 0.8 to 1.0;

an optically transparent layer having a planar top surface and laterally extending continuously over an entirety of the patterned layer stack and fills each opening within the array of openings; and an infrared blocking material layer overlying the first portion of the patterned layer stack and does not cover any of the second portion of the patterned layer stack.

14. The image sensor of claim 13, wherein:
the first portion of the patterned layer stack and the second portion of the patterned layer stack have an identical vertical sequence of component layers; and
each component layer within the patterned layer stack has a uniform thickness across the first portion of the patterned layer stack and the second portion of the patterned layer stack.

15. The image sensor of claim 13, wherein: one of the at least two metal layers comprises a refractory metal layer; and another of the at least two metal layers comprises a layer selected from a gold layer, a silver layer, a copper layer, and an aluminum layer.

16. The image sensor of claim 13, wherein the at least two metal layers comprises at least two layers selected from a gold layer, a silver layer, a copper layer, and an aluminum layer.

17. The image sensor of claim 13, further comprising:
first color filters contacting a respective segment of a top surface of the second portion of the patterned layer stack; and
second color filters contacting a respective surface segment of a top surface of the infrared blocking material layer,
wherein the infrared blocking material layer provides a higher absorption coefficient within a wavelength range from 800 nm to 1,600 nm than any of the second color filters.

18. The image sensor of claim 13, wherein the at least two metal layers underlies, and is in contact with a bottommost surface of, the N repetitions of the unit layer stack.

19. An image sensor comprising:
an array of image pixels located on a semiconductor substrate;
black level correction (BLC) pixels located adjacent to the array of image pixels on the semiconductor substrate;
a patterned layer stack extending over the array of image pixels and over the BLC pixels, wherein the patterned layer stack comprises N repetitions of a unit layer stack in which N instances of the unit layer stack are repeated along a vertical direction, wherein N is an integer in a range from 2 to 20, and wherein the unit layer stack includes a first material layer having a first refractive index and a second material layer having a second refractive index that is different from the first refractive index, and wherein the patterned layer stack comprises a first portion that overlies the BLC pixels and does not include any opening therethrough, and comprises a second portion having a pattern of a grid structure including an array of openings therein, wherein each opening in the grid structure overlies, and has a respective areal overlap with, a respective each image pixel within the array of image pixels for transmission of light therethrough, wherein the first portion of the patterned layer stack and the grid structure of the patterned layer stack are configured to block light in a wavelength range by generating a constructive interference pattern for the wavelength range such that a reflectivity of light within the wavelength range is in a range from 0.8 to 1.0;

an optically transparent layer having a planar top surface and laterally extending continuously over an entirety of the patterned layer stack and fills each opening within the array of openings;

an infrared blocking material layer overlying the first portion of the patterned layer stack and does not cover any of the second portion of the patterned layer stack;

first color filters contacting a respective segment of a top surface of the second portion of the patterned layer stack; and second color filters contacting a respective surface segment of a top surface of the infrared blocking material layer, wherein the infrared blocking material layer provides a higher absorption coefficient within a wavelength range from 800 nm to 1,600 nm than any of the second color filters.

20. The image sensor of claim 19, wherein:
the patterned layer stack includes at least two metal layers; and
one of the at least two metal layers comprises a respective wavelength sub-range having a greater reflectivity than another metal layer selected from the at least two metal layers within a wavelength range from 200 nm to 1,600 nm.

* * * * *